United States Patent
Baker

(10) Patent No.: US 10,658,018 B2
(45) Date of Patent: **\*May 19, 2020**

(54) QUANTIZING CIRCUITS HAVING IMPROVED SENSING

(71) Applicant: Ovonyx Memory Technology, Inc., Alexandria, VA (US)

(72) Inventor: Russel J. Baker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/554,244

(22) Filed: Aug. 28, 2019

(65) Prior Publication Data

US 2019/0385651 A1    Dec. 19, 2019

Related U.S. Application Data

(60) Continuation of application No. 16/184,798, filed on Nov. 8, 2018, now Pat. No. 10,403,339, which is a
(Continued)

(51) Int. Cl.
| | | |
|---|---|---|
| G11C 5/14 | (2006.01) | |
| G11C 7/22 | (2006.01) | |
| G11C 11/56 | (2006.01) | |
| G11C 7/16 | (2006.01) | |
| G11C 7/06 | (2006.01) | |

(Continued)

(52) U.S. Cl.
CPC ............. *G11C 7/22* (2013.01); *G11C 5/147* (2013.01); *G11C 7/065* (2013.01); *G11C 7/16* (2013.01); *G11C 8/08* (2013.01); *G11C 11/5642* (2013.01); *G11C 11/5678* (2013.01); *G11C 13/0004* (2013.01); *G11C 2211/5634* (2013.01);
(Continued)

(58) Field of Classification Search
CPC .. G11C 5/147; G11C 7/12; G11C 8/08; G11C 7/222; G11C 29/12005; G11C 7/1066
See application file for complete search history.

(56) References Cited

U.S. PATENT DOCUMENTS

| | | | |
|---|---|---|---|
| 4,460,982 | A | 7/1984 | Gee et al. |
| 5,218,569 | A | 6/1993 | Banks |

(Continued)

OTHER PUBLICATIONS

Rane Corporation, RaneNote 137, "Digital Charma of Audio A/D Converters," 1997, 12 pgs.
(Continued)

*Primary Examiner* — Hien N Nguyen
(74) *Attorney, Agent, or Firm* — Fletcher Yoder, P.C.

(57) ABSTRACT

A system including a processor and a memory device. The memory device includes a memory array having a plurality of memory elements connected to a bit-line and a quantizing circuit. The quantizing circuit includes a combination circuit configured to combine an analog input signal with an analog feedback signal to produce a delta signal. The quantizing circuit also includes an integrator configured to receive and integrate the delta signal to produce a sigma signal. The quantizing circuit also includes an analog-to-digital converter configured to receive the sigma signal and compare the sigma signal with a reference signal to produce a digital output signal.

20 Claims, 20 Drawing Sheets

Related U.S. Application Data continuation of application No. 15/269,418, filed on Sep. 16, 2016, now Pat. No. 10,127,954, which is a continuation of application No. 15/074,759, filed on Mar. 18, 2016, now Pat. No. 9,449,664, which is a continuation of application No. 14/507,452, filed on Oct. 6, 2014, now Pat. No. 9,299,405, which is a division of application No. 14/076,908, filed on Nov. 11, 2013, now Pat. No. 8,854,899, which is a division of application No. 13/486,535, filed on Jun. 1, 2012, now Pat. No. 8,582,375, which is a division of application No. 12/951,997, filed on Nov. 22, 2010, now Pat. No. 8,194,477, which is a division of application No. 11/820,003, filed on Jun. 15, 2007, now Pat. No. 7,839,703.

(51) Int. Cl.
*G11C 8/08* (2006.01)
*G11C 13/00* (2006.01)
*H03M 3/00* (2006.01)

(52) U.S. Cl.
CPC ....... *G11C 2211/5644* (2013.01); *H03M 3/43* (2013.01); *H03M 3/456* (2013.01)

(56) References Cited

U.S. PATENT DOCUMENTS

| | | | |
|---|---|---|---|
| 5,600,319 A | 2/1997 | Ginetti | |
| 5,614,856 A | 3/1997 | Wilson et al. | |
| 5,627,784 A | 5/1997 | Roohparvar | |
| 5,748,535 A | 5/1998 | Lin et al. | |
| 5,953,276 A | 9/1999 | Baker | |
| 5,973,956 A | 10/1999 | Blyth et al. | |
| 6,044,019 A | 3/2000 | Cernea et al. | |
| 6,097,637 A | 8/2000 | Bauer et al. | |
| 6,188,340 B1 | 2/2001 | Matsumoto et al. | |
| 6,282,120 B1 | 8/2001 | Cernea et al. | |
| 6,466,476 B1 | 10/2002 | Wong et al. | |
| 6,490,200 B2 | 12/2002 | Cernea et al. | |
| 6,504,750 B1 | 1/2003 | Baker | |
| 6,567,297 B2 | 5/2003 | Baker | |
| 6,661,708 B2 | 12/2003 | Cernea et al. | |
| 6,664,708 B2 | 12/2003 | Shlimak et al. | |
| 6,665,013 B1 | 12/2003 | Fossum et al. | |
| 6,741,502 B1 | 5/2004 | Cernea | |
| 6,781,906 B2 | 8/2004 | Perner et al. | |
| 6,785,156 B2 | 8/2004 | Baker | |
| 6,795,359 B1 | 9/2004 | Baker | |
| 6,798,705 B2 | 9/2004 | Baker | |
| 6,807,403 B2 | 10/2004 | Tanaka | |
| 6,813,208 B2 | 11/2004 | Baker | |
| 6,822,892 B2 | 11/2004 | Baker | |
| 6,826,102 B2 | 11/2004 | Baker | |
| 6,829,188 B2 | 12/2004 | Choi | |
| 6,847,234 B2 | 1/2005 | Mokhlesi et al. | |
| 6,850,441 B2 | 2/2005 | Baker | |
| 6,856,564 B2 | 2/2005 | Baker | |
| 6,870,784 B2 | 3/2005 | Baker | |
| 6,901,020 B2 | 5/2005 | Doerrer et al. | |
| 6,909,394 B2 | 6/2005 | Baker | |
| 6,914,838 B2 | 7/2005 | Baker | |
| 6,930,942 B2 | 8/2005 | Baker | |
| 6,954,390 B2 | 10/2005 | Baker | |
| 6,954,391 B2 | 10/2005 | Fletcher et al. | |
| 6,977,601 B1 | 12/2005 | Baker | |
| 6,985,375 B2 | 1/2006 | Hush et al. | |
| 7,002,833 B2 | 2/2006 | Baker | |
| 7,009,901 B2 | 3/2006 | Baker | |
| 7,095,667 B2 | 8/2006 | Baker | |
| 7,102,932 B2 | 9/2006 | Baker | |
| 7,133,307 B2 | 11/2006 | Combe et al. | |
| 7,151,701 B2 | 12/2006 | Taylor et al. | |
| 7,366,021 B2 | 4/2008 | Baker | |
| 7,538,702 B2 | 5/2009 | Baker | |
| 7,667,632 B2 | 2/2010 | Baker | |
| 7,768,868 B2 | 8/2010 | Baker | |
| 7,817,073 B2 | 10/2010 | Baker | |
| 8,194,477 B2 | 6/2012 | Baker | |
| 9,449,664 B2 | 9/2016 | Baker | |
| 10,403,339 B2 * | 9/2019 | Baker | |
| 2002/0101758 A1 | 8/2002 | Baker | |
| 2002/0194557 A1 | 12/2002 | Park | |
| 2003/0039162 A1 | 2/2003 | Baker | |
| 2003/0043616 A1 | 3/2003 | Baker | |
| 2003/0067797 A1 | 4/2003 | Baker | |
| 2003/0198078 A1 | 10/2003 | Baker | |
| 2003/0214868 A1 | 11/2003 | Baker | |
| 2004/0008555 A1 | 1/2004 | Baker | |
| 2004/0032760 A1 | 2/2004 | Baker | |
| 2004/0062100 A1 | 4/2004 | Baker | |
| 2004/0076052 A1 | 4/2004 | Baker | |
| 2004/0095839 A1 | 5/2004 | Baker | |
| 2004/0190327 A1 | 9/2004 | Baker | |
| 2004/0190334 A1 | 9/2004 | Baker | |
| 2004/0199710 A1 | 10/2004 | Baker | |
| 2004/0240294 A1 | 12/2004 | Baker | |
| 2005/0002249 A1 | 1/2005 | Baker | |
| 2005/0007803 A1 | 1/2005 | Baker | |
| 2005/0007850 A1 | 1/2005 | Baker | |
| 2005/0013184 A1 | 1/2005 | Baker | |
| 2005/0018477 A1 | 1/2005 | Baker | |
| 2005/0018512 A1 | 1/2005 | Baker | |
| 2005/0041128 A1 | 2/2005 | Baker | |
| 2005/0088892 A1 | 4/2005 | Baker | |
| 2005/0088893 A1 | 4/2005 | Baker | |
| 2005/0201145 A1 | 9/2005 | Baker | |
| 2006/0013040 A1 | 1/2006 | Baker | |
| 2006/0062062 A1 | 3/2006 | Baker | |
| 2006/0221696 A1 | 10/2006 | Li | |
| 2006/0227641 A1 | 10/2006 | Baker | |
| 2006/0250853 A1 | 11/2006 | Taylor et al. | |
| 2006/0291291 A1 | 12/2006 | Hosono et al. | |
| 2008/0095213 A1 | 4/2008 | Lin et al. | |
| 2008/0297388 A1 | 12/2008 | Thiagarajan et al. | |
| 2008/0309530 A1 | 12/2008 | Baker | |
| 2008/0309534 A1 | 12/2008 | Baker | |
| 2008/0310236 A1 | 12/2008 | Baker | |
| 2012/0243343 A1 | 9/2012 | Baker | |

OTHER PUBLICATIONS

Baker, R.J., (2001-2006) *Sensing Circuits for Resistive Memory*, presented at various universities and companies.

Baker, "*CMOS Mixed Signal Circuit Design*," IEEE Press, A. John Wiley & Sons, Inc.; Copyright 2003, Figures 30.63, 31.82, 32.6, 32.7, 32.24, 32.51, 33.34, 33.47, 33.51, 34.18, 34.24; located at http://cmosedu.com/cmos2/book2.htm.

Dallas Semiconductor, Maxim Application Note 1870, "*Demystifying Sigma-Delta ADCs*," (Jan. 31, 2003), 15 pgs.

Baker, R.J., (2003) *Mixed-Signal Design in the Microelectronics Curriculum*, IEEE University/Government/Industry Microelectronics (UGIM) Symposium, Jun. 30-Jul. 2, 2003.

Baker, R.J. (2004) *Delta-Sigma Modulation for Sensing*, IEEE/EDS Workshop on Microelectronics and Electron Devices (WMED), Apr. 2004.

Baker, "*CMOS Circuit Design, Layout, and Simulation*," Second Edition, IEEE Press, A. John Wiley & Sons, Inc.; Copyright 2005; Chapters 13, 16, 17, 20, 22-24, 28-29; pp. 375-396, 433-522, 613-656, 711-828, 931-1022.

Hadrick, M. and Baker, R.J., (2005) *Sensing in CMOS Imagers using Delta-Sigma Modulation*, a general presentation of our work in this area.

Baker, R.J. (2005) *Design of High-Speed CMOS Op-Amps for Signal Processing*, IEEE/EDS Workshop on Microelectronics and Electron Devices (WMED), Apr. 2005.

Leslie, M.B., and Baker, R.J., (2006) "*Noise-Shaping Sense Amplifier for MRAM Cross-Point Arrays*," IEEE Journal of Solid State Circuits, vol. 41, No. 3, pp. 699-704.

(56) References Cited

OTHER PUBLICATIONS

Duvvada, K., Saxena, V., and Baker, R. J., (2006) *High Steed Digital Input Buffer Circuits*, proceedings of the IEEE/EDS Workshop on Microelectronics and Electron Devices (WMED), pp. 11-12, Apr. 2006.

Saxena, V., Plum, T.J., Jessing, J.R., and Baker, R. J., (2006) *Design and Fabrication of a MEMS Capacitive Chemical Sensor System*, proceedings of the IEEE/EDS Workshop on Microelectronics and Electron Devices (WMED), pp. 17-18, Apr. 2006.

Baker, R.J. and Saxena, V., (2007) *Design of Bandpass Delta Sigma Modulators: Avoiding Common Mistakes*. presented at various universities and companies.

Wikipedia—definition of "Error detection and correction", pulled from website Jun. 1, 2007, 9 pgs.

Wikipedia—definition of "Hamming code", pulled from website Jun. 1, 2007, 8 pgs.

Wikipedia—definition of "Linear feedback shift register (LFSR)," pulled from website Jun. 1, 2007, 4 pgs.

Park, "*Motorola Digital Signal Processors—Principles of Sigma-Delta Modulation for Analog-to-Digital Converters*," Feb. 2010, pp. 1-71.

\* cited by examiner

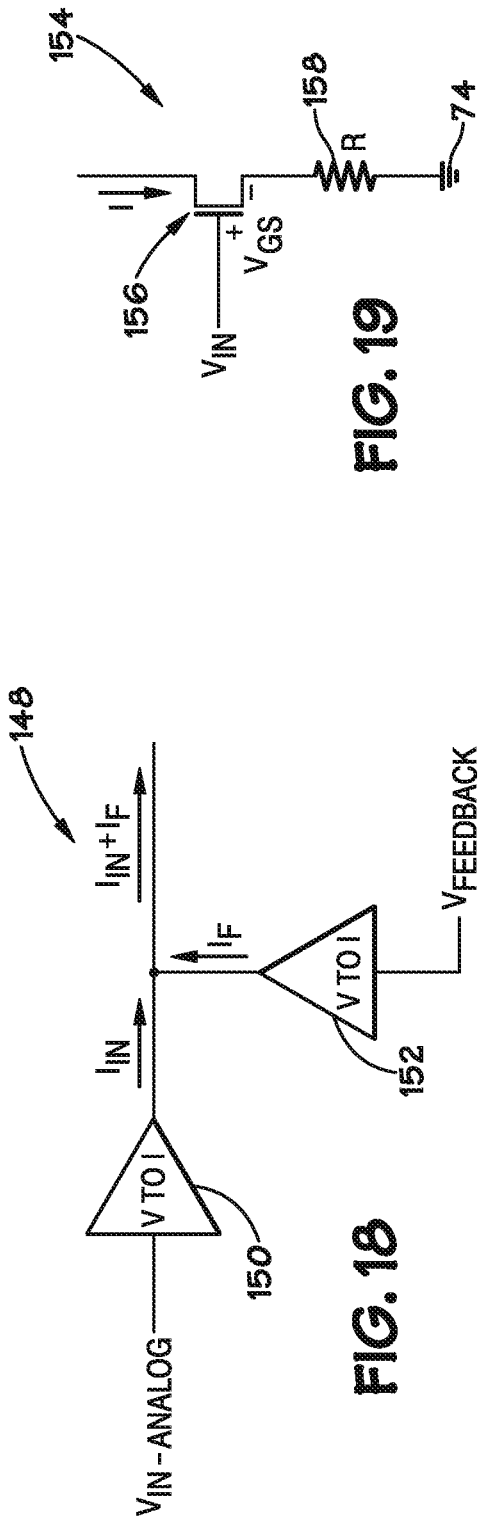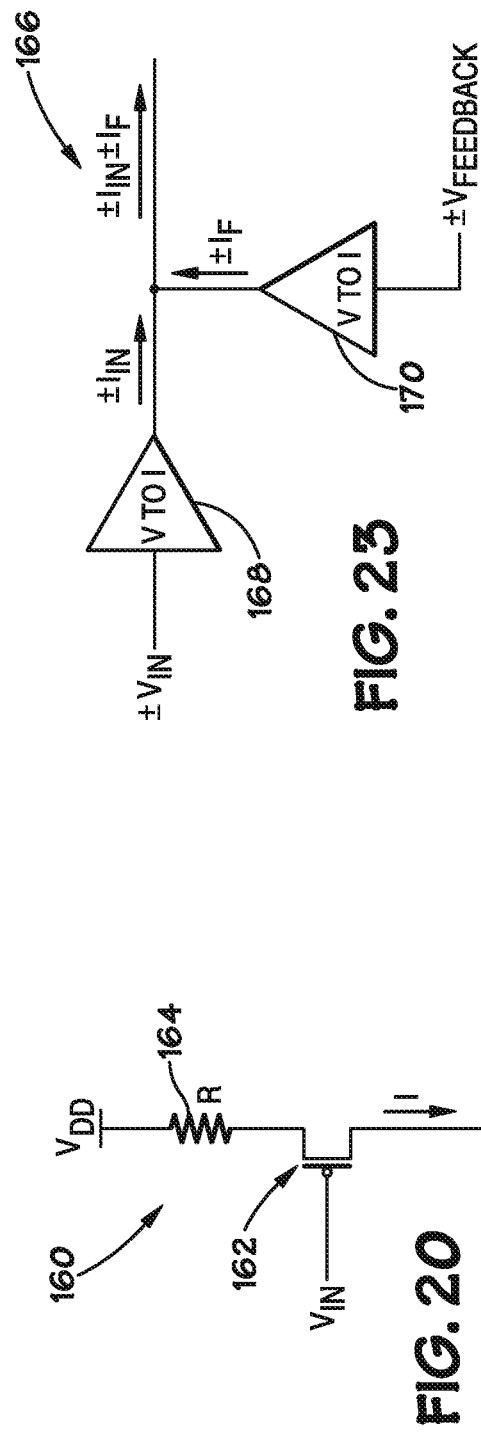

QUANTIZING CIRCUITS HAVING IMPROVED SENSING

CROSS-REFERENCE TO RELATED APPLICATION

This application is a continuation of U.S. patent application Ser. No. 16/184,798 which was filed Nov. 8, 2018, now U.S. Pat. No. 10,403,339, which issued Sep. 3, 2019, which is a continuation of U.S. patent application Ser. No. 15/269,418 which was filed Sep. 19, 2016, now U.S. Pat. No. 10,127,954, which issued on Nov. 13, 2018, which is a continuation U.S. patent application Ser. No. 15/074,759 which was filed on Mar. 18, 2016, now U.S. Pat. No. 9,449,664, which is a continuation of U.S. patent application Ser. No. 14/507,452 which was filed on Oct. 6, 2014, now U.S. Pat. No. 9,299,405, which is a divisional of U.S. patent application Ser. No. 14/076,908, which was filed on Nov. 11, 2013, now U.S. Pat. No. 8,854,899, which is a divisional of U.S. patent application Ser. No. 13/486,535, which was filed on Jun. 1, 2012, now U.S. Pat. No. 8,582,375, which is a divisional of U.S. patent application Ser. No. 12/951,997, which was filed on Nov. 22, 2010, now U.S. Pat. No. 8,194,477, which is a divisional of U.S. patent application Ser. No. 11/820,003, which was filed on Jun. 15, 2007, now U.S. Pat. No. 7,839,703.

BACKGROUND

Field of the Invention

Embodiments of the present invention relate generally to electronic devices and, more specifically, to subtraction circuits and digital-to-analog converters for delta-sigma modulators in electronic devices.

Description of the Related Art

Generally, memory devices include an array of memory elements and associated sense amplifiers. The memory elements store data, and the sense amplifiers read the data from the memory elements. To read data, for example, a current is passed through the memory element, and the current or a resulting voltage is measured by the sense amplifier. Conventionally, the sense amplifier measures the current or voltage by comparing it to a reference current or voltage. Depending on whether the current or voltage is greater than the reference, the sense amplifier outputs a value of one or zero. That is, the sense amplifier quantizes or digitizes the analog signal from the memory element into one of two logic states.

Many types of memory elements are capable of assuming more than two states. That is, some memory elements are capable of multi-bit storage. For instance, rather than outputting either a high or low voltage, the memory element may output four or eight different voltage levels, each level corresponding to a different data value. However, conventional sense amplifiers often fail to distinguish accurately between the additional levels because the difference between the levels (e.g., a voltage difference) in a multi-bit memory element is often smaller than the difference between the levels in a single-bit memory element. Thus, conventional sense amplifiers often cannot read multi-bit memory elements reliably. This problem may be increased as high performance multi-bit memory elements become increasingly dense, thereby reducing the size of the memory elements and the difference between the levels (e.g., voltage) to be sensed by the sense amplifiers.

A variety of factors may tend to prevent the sense amplifier from discerning small differences in the levels of a multi-bit memory element. For instance, noise in the power supply, ground, and reference voltage may cause an inaccurate reading of the memory element. The noise may have a variety of sources, such as temperature variations, parasitic signals, data dependent effects, and manufacturing process variations. This susceptibility to noise often leads a designer to reduce the number of readable states of the memory element, which tends to reduce memory density and increase the cost of memory.

Conventional sense amplifiers present similar problems in imaging devices. In these devices, an array of light sensors output a current or voltage in response to light impinging upon the sensor. The magnitude of the current or voltage typically depends upon the intensity of the light. Thus, the capacity of the sense amplifier to accurately convert the current or voltage into a digital signal may determine, in part, the fidelity of the captured image. Consequently, noise affecting the sense amplifier may diminish the performance of imaging devices.

BRIEF DESCRIPTION OF THE DRAWINGS

FIG. 18 illustrates an example of an adder in accordance with an embodiment of the present invention;

FIGS. 19 and 20 each illustrate respective examples of a voltage-to-current converter in accordance with an embodiment of the present invention;

FIG. 23 illustrates a second example of an adder in accordance with an embodiment of the present invention;

DETAILED DESCRIPTION OF SPECIFIC EMBODIMENTS

Various embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently described embodiments may address one or more of the problems with conventional sense amplifiers discussed above. Some embodiments include a quantizing circuit configured to detect small differences in voltages and/or currents. As explained below, the quantizing circuit may sample the measured electrical parameter on multiple occasions and filter, e.g., average or sum, the samples to reduce the impact of noise. As a result, in some embodiments, the quantizing circuit may resolve small differences between voltage or current levels in multi-bit memory elements and/or light sensors, which may allow circuit designers to increase the number of bits stored per memory element and/or the sensitivity of an imaging device.

The following description begins with an overview of examples of systems that employ quantizing circuits in accordance with embodiments of the present invention, and the problems within these systems that may be addressed by the quantizing circuits as described with reference to FIGS. 1-7. Then, specific examples of a quantizing circuit are described with reference to FIGS. 8-15. Next, block diagrams of delta-sigma modulators that may be employed in a quantizing circuit are described with reference to the FIGS. 16 and 17. Finally, circuits for subtracting voltages in a delta-sigma modulator are described with reference to FIGS. 18-25, and circuits for supplying a reference current to a delta-sigma modulator are described with reference to the FIGS. 26-29.

Figure 1:
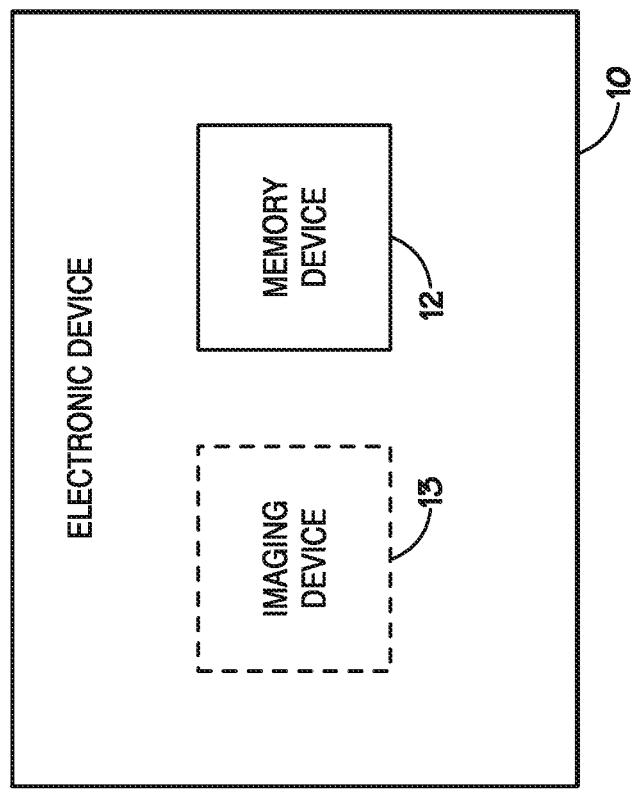
FIG. 1 illustrates an electronic device in accordance with an embodiment of the present invention.

FIG. 1 depicts an electronic device 10 that may be fabricated and configured in accordance with one or more of the present embodiments. The illustrated electronic device 10 includes a memory device 12 that, as explained further below, may include multi-bit memory elements and quantizing circuits. Alternatively, or additionally, the electronic device 10 may include an imaging device 13 having the quantizing circuits.

Myriad devices may embody one or more of the present techniques. For example, the electronic device 10 may be a storage device, a communications device, an entertainment device, an imaging system, or a computer system, such as a personal computer, a server, a mainframe, a tablet computer, a palm-top computer, or a laptop.

Figure 2:
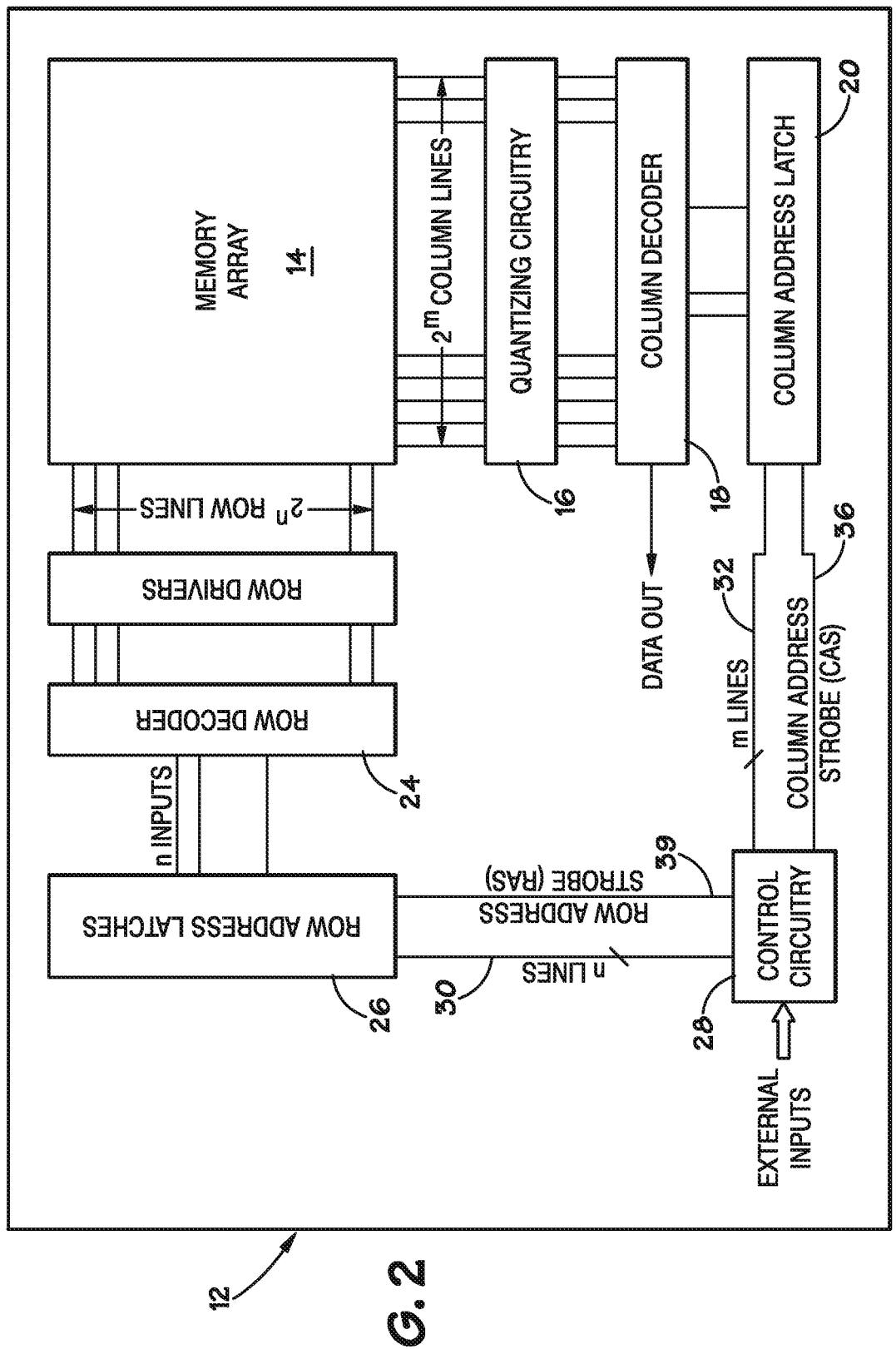
FIG. 2 illustrates a memory device in accordance with an embodiment of the present invention.

FIG. 2 depicts a block diagram of an embodiment of the memory device 12. The illustrated memory device 12 may include a memory array 14, a quantizing circuit 16, a column decoder 18, a column address latch 20, row drivers 22, a row decoder 24, row address latches 26, and control circuitry 28. As described below with reference to FIG. 3, the memory array 14 may include a matrix of memory elements arranged in rows and columns. As will be appreciated, the imaging device 13 (FIG. 1) may include similar features except that in the case of an imaging device 13, the memory array 14 will include a matrix of imaging elements, such as complementary-metal-oxide semiconductor (CMOS) imaging elements.

When accessing the memory elements, the control circuitry may receive a command to read from or write to a target memory address. The control circuitry 28 may then convert the target address into a row address and a column address. In the illustrated embodiment, the row address bus 30 transmits the row address to the row address latches 26, and a column address bus 32 transmits column address to the column address latches 20. After an appropriate settling time, a row address strobe (RAS) signal 39 (or other controlling clock signal) may be asserted by the control circuitry 28, and the row address latches 26 may latch the transmitted row address. Similarly, the control circuitry 28 may assert a column address strobe 36, and the column address latches 20 may latch the transmitted column address.

Once row and column addresses are latched, the row decoder 24 may determine which row of the memory array 14 corresponds to the latched row address, and the row drivers 22 may assert a signal on the selected row. Similarly, the column decoder 18 may determine which column of the memory array 14 corresponds with the latched column address, and the quantizing circuit 16 may sense a voltage or current on the selected column. Additional details of reading and writing are described below.

Figure 3:
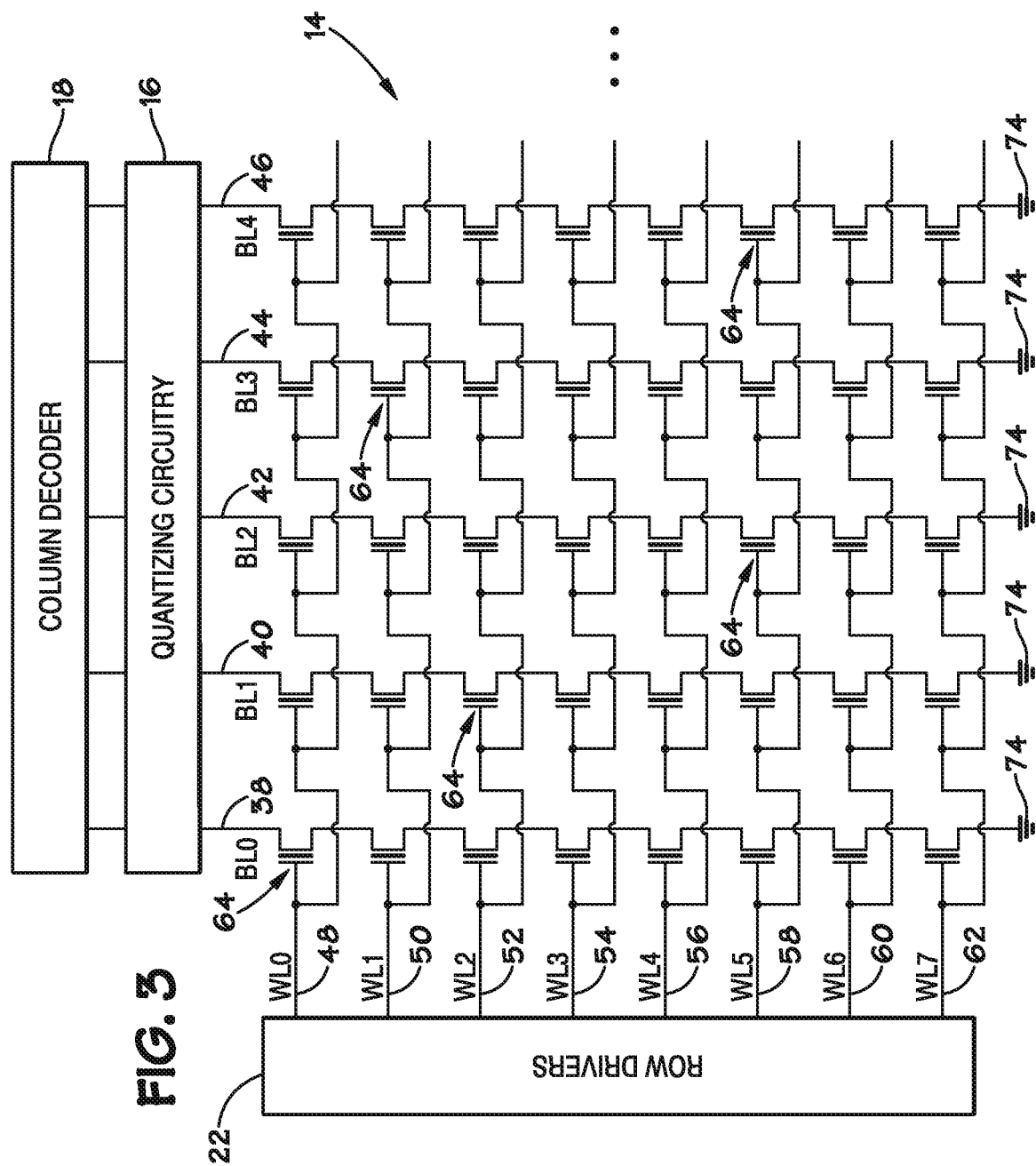
FIG. 3 illustrates a memory array in accordance with an embodiment of the present invention.

FIG. 3 illustrates an example of a memory array 14. The illustrated memory array 14 includes a plurality of bit-lines 38, 40, 42, 44, and 46 (also referred to as BL0-BL4) and a plurality of word-lines 48, 50, 52, 54, 56, 58, 60, and 62 (also referred to as WL0-WL7). These bit-lines and word-lines are electrical conductors. The memory array 14 further includes a plurality of memory elements 64, each of which may be arranged to intersect one of the bit-lines and one of the word-lines. In other embodiments, imaging elements may be disposed at each of these intersections. The memory elements and imaging elements may be referred to generally as internal data storage locations, i.e., devices configured to convey data, either stored or generated by a sensor, when accessed by a sensing circuit, such as the quantizing circuits discussed below. The internal data storage locations may be formed on an integrated semiconductor device that also includes the other components of the memory device 12 (or imaging device 13).

In some embodiments, the illustrated memory elements 64 are flash memory devices. The operation of the flash memory elements is described further below with reference to the FIGS. 4 and 5. It should be noted that, in other embodiments, the memory elements 64 may include other types of volatile or nonvolatile memory. For example, the memory elements 64 may include a resistive memory, such as a phase change memory or magnetoresistive memory. In another example, the memory elements 64 may include a capacitor, such as a stacked or trench capacitor. Some types of memory elements 64 may include an access device, such as a transistor or a diode associated with each of the memory elements 64, or the memory elements 64 may not include an access device, for instance in a cross-point array.

Figure 4:
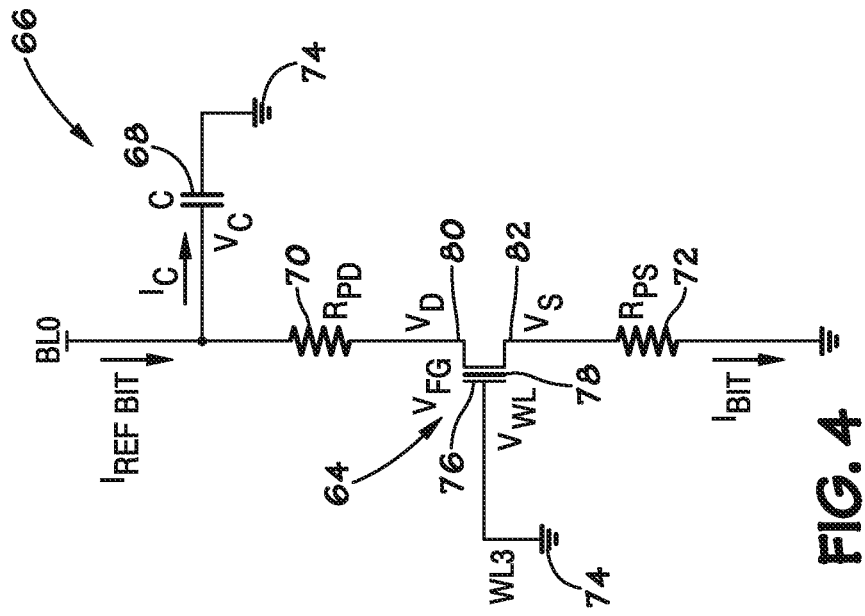
FIG. 4 illustrates a memory element in accordance with an embodiment of the present invention.

FIG. 4 illustrates a circuit 66 that models the operation of an arbitrarily selected memory element 64, which is disposed at the intersection of WL3 and BL0. This circuit 66 includes a capacitor 68, a pre-drain resistor 70 ($R_{PD}$), a post-source resistor 72 ($R_{PS}$), and a ground 74. The resistors 70 and 72 model the other devices in series the memory element 64 being sensed. The illustrated memory element 64 includes a gate 76, a floating gate 78, a drain 80, and a source 82. In the circuit 66, the drain 80 and source 82 are disposed in series between the pre-drain resistor 70 and the post-source resistor 72. The gate 76 is coupled to WL3. The pre-drain resistor 70, the drain 80, the source 82, and the post-source resistor 72 are disposed in series on the bit-line BL0. The capacitor 68, which models the capacitance of the bit-line, has one plate coupled to ground 74 and another plate coupled to the bit-line BL0, in parallel with the memory elements 64.

Several of the components of the circuit 66 represent phenomenon affecting the memory elements 64 during operation. The pre-drain resistor 70 generally represents the drain-to-bitline resistance of the memory elements 64 coupled to the bit-line above (i.e., up current from) WL3 when these memory elements 64 are turned on, (e.g., during a read operation). Similarly, the post source resistor 72 generally corresponds to the source-to-ground resistance of the memory elements 64 coupled to the bit-line below WL3 when these memory element 64 is selected. The circuit 66 models electrical phenomena associated with reading the memory elements 64 at the intersection of WL3 and BL0.

Figure 5:
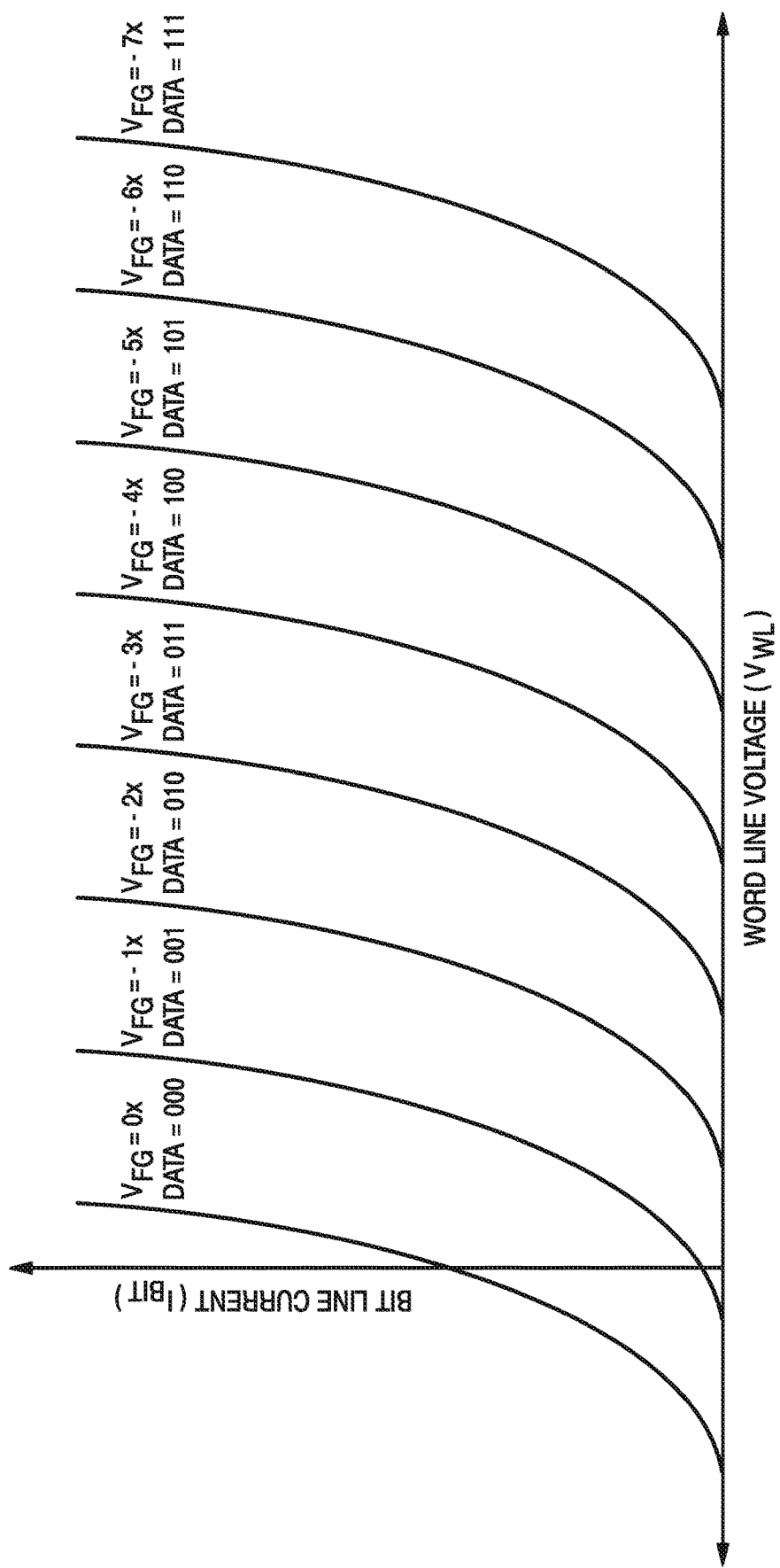
FIG. 5 illustrates I-V traces of memory elements storing different values, in accordance with an embodiment of the present invention.

The operation of the memory elements 64 will now be briefly described with reference to FIGS. 4 and 5. FIG. 5 illustrates one potential relationship between the bit-line current ($I_{Bit}$), the word-line voltage ($V_{WL}$), and the voltage of the floating gate 78 ($V_{FG}$). As illustrated by FIG. 5, $V_{FG}$ affects the response of the memory element 64 to a given $V_{WL}$. Decreasing the voltage of the floating gate shifts the I-V curve of the memory elements 64 to the right. That is, the relationship between the bit-line current and a word-line voltage depends on the voltage of the floating gate 78. The memory elements 64 may store and output data by exploiting this effect.

To write data to the memory elements 64, a charge corresponding to the data may be stored on the floating gate 78. The charge of the floating gate 78 may be modified by applying voltages to the source 82, drain 80, and/or gate 76 such that the resulting electric fields produce phenomenon like Fowler-Northam tunneling and/or hot-electron injection near the floating gate 78. Initially, the memory elements 64 may be erased by manipulating the word-line voltage to drive electrons off of the floating gate 78. In some embodiments, an entire column or block of memory elements 64 may be erased generally simultaneously. Once the memory elements 64 are erased, the gate 76 voltage may be manipulated to drive a charge onto the floating gate 78 that is indicative of a data value. After the write operation ends, the stored charge may remain on the floating gate 78 (i.e., the memory elements 64 may store data in a nonvolatile fashion).

As illustrated by FIG. 5, the value stored by the memory element 64 may be read by applying a voltage, $V_{WL}$, to the gate 76 and measuring a resulting bit-line current, $I_{Bit}$. Each of the I-V traces depicted by FIG. 5 correspond to a different charge stored on the floating gate, $V_{FG}$, which should not be confused with the voltage that is applied to the gate, $V_{WL}$. The difference in floating gate 70 voltage, $V_{FG}$, between each I-V trace is an arbitrarily selected scaling factor "x." The illustrated I-V traces correspond to eight-different data values stored by the memory element 64, with a $V_{FG}$ of 0x representing a binary data value of 000, a $V_{FG}$ of 1x representing a binary data value of 001, and so on through $V_{FG}$ of 7x, which represents a binary data value of 111. Thus, by applying a voltage to the gate 76 and measuring the resulting bit-line current, the charge stored on the floating gate 78 may be measured, and the stored data may be read.

The accuracy with which the bit-line current is sensed may affect the amount of data that a designer attempts to store in each memory element 64. For example, in a system with a low sensitivity, a single bit may be stored on each memory element 64. In such a system, a floating gate voltage $V_{FG}$ of 0x may correspond to a value of 0, and a floating gate voltage $V_{FG}$ of −7x may correspond to a value of one. Thus, the difference in floating gate voltages $V_{FG}$ corresponding to different data values may be relatively large, and the resulting differences and bit-line currents for different data values may also be relatively large. As a result, even low-sensitivity sensing circuitry may discern these large differences in bit-line current during a read operation. In contrast, high-sensitivity sensing circuitry may facilitate storing more data in each memory element 64. For instance, if the sensing circuitry can distinguish between the eight different I-V traces depicted by FIG. 5, then the memory elements 64 may store three bits. That is, each of the eight different charges stored on the floating gate 78 may correspond to a different three-bit value: 000, 001, 010, 011, 100, 101, 110, or 111. Thus, circuitry that precisely measures the bit-line current $I_{BIT}$ may allow a designer to increase the amount of data stored in each memory element 64.

Figure 6:
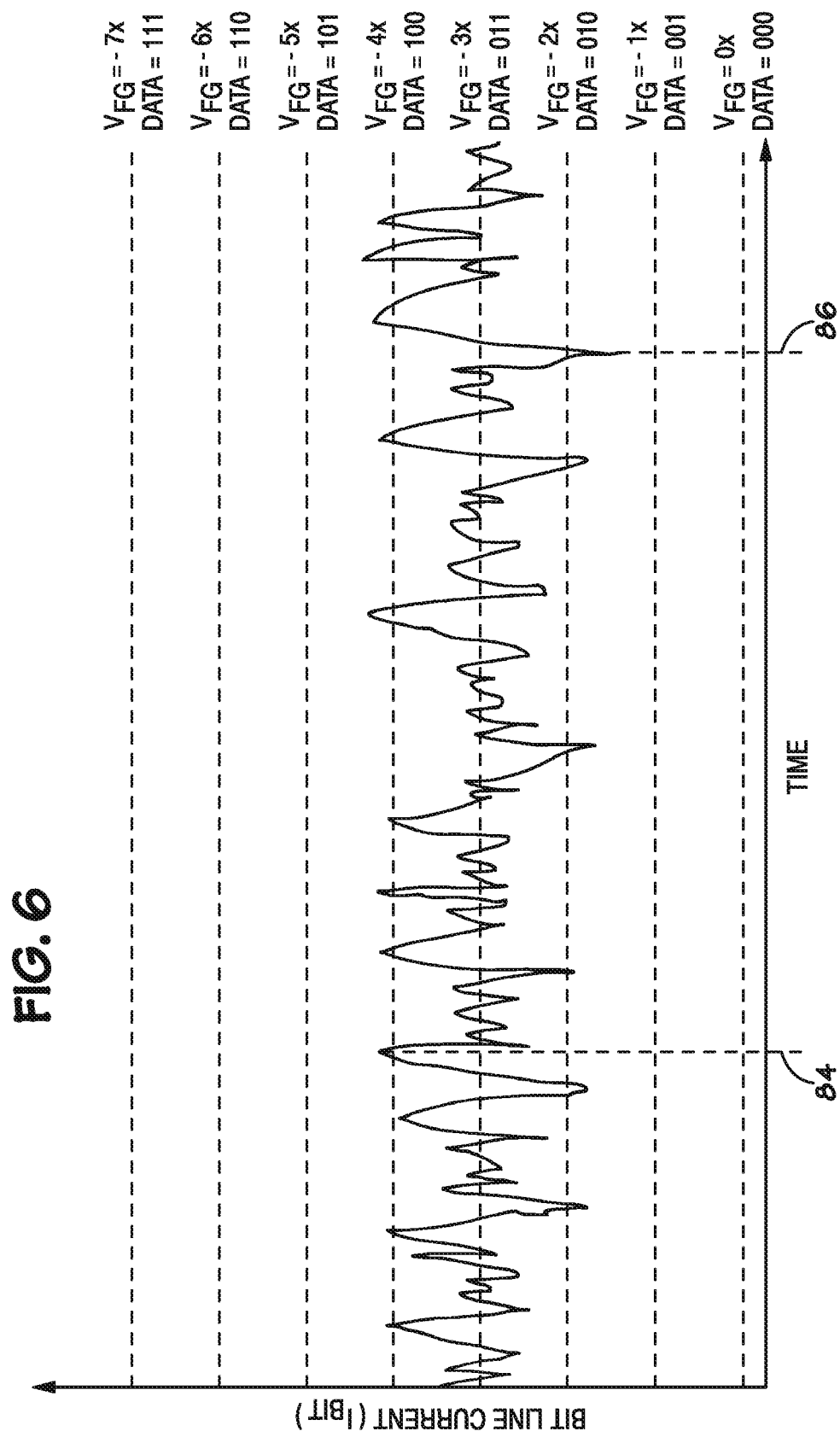
FIG. 6 illustrates noise in the bit-line current during a read operation.

However, as mentioned above, a variety of effects may interfere with accurate measurement of the bit-line current. For instance, the position of the memory elements 64 along a bit-line may affect $R_{PD}$ and $R_{PS}$, which may affect the relationship between the word-line voltage $V_{WL}$ and the bit-line current $I_{BIT}$. To illustrate these effects, FIG. 6 depicts noise on the bit-line while reading from the memory element 64. As illustrated, noise in the bit-line current $I_{BIT}$ may cause the bit-line current $I_{BIT}$ to fluctuate. Occasionally, the fluctuation may be large enough to cause the bit-line current $I_{BIT}$ to reach a level that corresponds with a different stored data value, which could cause the wrong value to be read from the memory elements 64. For instance, if the bit-line current is sensed at time 84, corresponding to an arbitrarily selected peak, a data value of 100 may be read rather than the correct data value of 011. Similarly, if the bit-line current is sensed at time 86, corresponding to an arbitrarily selected local minimum, a data value of 010 may be read rather than a data value of 011. Thus, noise on the bit-line may cause erroneous readings from memory elements 64.

Figure 7:
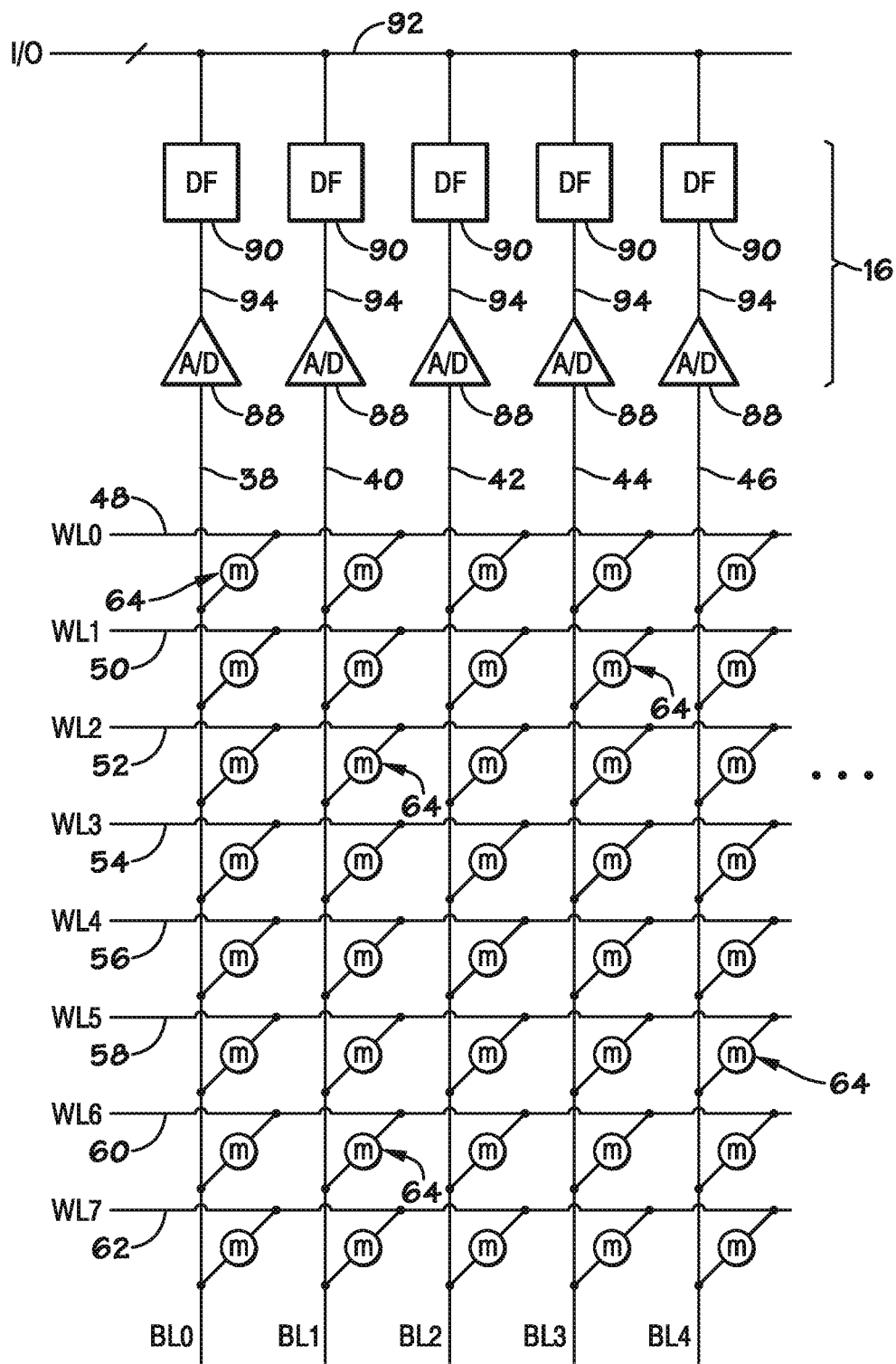
FIG. 7 illustrates a quantizing circuit in accordance with an embodiment of the present invention.

FIG. 7 depicts a quantizing circuit 16 that may tend to reduce the likelihood of an erroneous reading. The illustrated quantizing circuit 16 includes an analog-to-digital converter 88 and a digital filter 90 coupled to each of the bit-lines 38, 40, 42, 44, and 46, respectively. That is, each bit-line 38, 40, 42, 44, and 46 may connect to a different analog-to-digital converter 88 and digital filter 90. The digital filters 90, in turn, may connect to an input/output bus 92, which may connect to a column decoder 18, a column address latch 20, and/or control circuitry 28 (see FIG. 2).

In operation, the quantizing circuit 16 may digitize analog signals from the memory elements 64 in a manner that is relatively robust to noise. As explained below, the quantizing circuit 16 may do this by converting the analog signals into a bit-stream and digitally filtering high-frequency components from the bit-stream.

The analog-to-digital converter 88 may be a one-bit, analog-to-digital converter or a multi-bit, analog-to-digital converter. In the present embodiment, an analog-to-digital converter 88 receives an analog signal from the memory element 64, e.g., a bit-line current $I_{BIT}$ or a bit-line voltage $V_{BL}$, and outputs a bit-stream that corresponds with the analog signal. The bit-stream may be a one-bit, serial signal with a time-averaged value that generally represents or corresponds to the time-averaged value of the analog signal from the memory element 64. That is, the bit-stream may fluctuate between values of zero and one, but its average value, over a sufficiently large period of time, may be proportional to the average value of the analog signal from the memory element 64. In certain embodiments, the bit-stream from the analog-to-digital converter 88 may be a pulse-density modulated (PDM) version of the analog signal. The analog-to-digital converter 88 may transmit the bit-stream to the digital filter 90 on a bit-stream signal path 94.

The digital filter 90 may remove high-frequency noise from the bit-stream. To this end, the digital filter 90 may be a low-pass filter, such as a counter, configured to average or integrate the bit-stream over a sensing time, i.e., the time period over which the memory element 64 is read. As a result, the digital filter 90 may output a value that is representative of both the average value of the bit-stream and the average value of the analog signal from the memory element 64. In some embodiments, the digital filter 90 is a counter, and the cut-off frequency of the digital filter 90 may be selected by adjusting the duration of the sensing time. In the present embodiment, increasing the sensing time will lower the cutoff frequency. That is, the frequency response of the digital filter 90 may be tuned by adjusting the period of time over which the bit-stream is integrated and/or averaged before outputting a final value. The frequency response of the digital filter 90 is described further below with reference to FIG. 15. For multi-bit memory elements 64, the output from the digital filter 90 may be a multi-bit binary signal, e.g., a digital word that is transmitted serially and/or in parallel.

Advantageously, in certain embodiments, the quantizing circuit 16 may facilitate the use of multi-bit memory elements 64. As described above, in traditional designs, the number of discrete data values that a memory element 64 stores may be limited by sense amps that react to noise. In contrast, the quantizing circuit 16 may be less susceptible to noise, and, as a result, the memory elements 64 may be configured to store additional data. Without the high frequency noise, the intervals between signals representative of different data values may be made smaller, and the number of data values stored by a given memory element 64 may be increased. Thus, beneficially, the quantizing circuit 16 may sense memory elements 64 that store several bits of data, e.g., 2, 3, 4, 5, 6, 7, 8, or more bits per memory element 64.

Although the quantizing circuit 16 may sample the signal from the memory element 64 over a longer period of time than conventional designs, the overall speed of the memory device 12 may be improved. As compared to a conventional device, each read or write operation of the memory device 12 may transfer more bits of data into or out of the memory element 64. As a result, while each read or write operation may take longer, more data may be read or written during the operation, thereby improving overall performance. Further, in some memory devices 12, certain processes may be performed in parallel with a read or write operation, thereby further reducing the overall impact of the longer sensing time. For example, in some embodiments, the memory array 14 may be divided into banks that operate at least partially independently, so that, while data is being written or read from one bank, another bank can read or write data in parallel.

Figure 8:
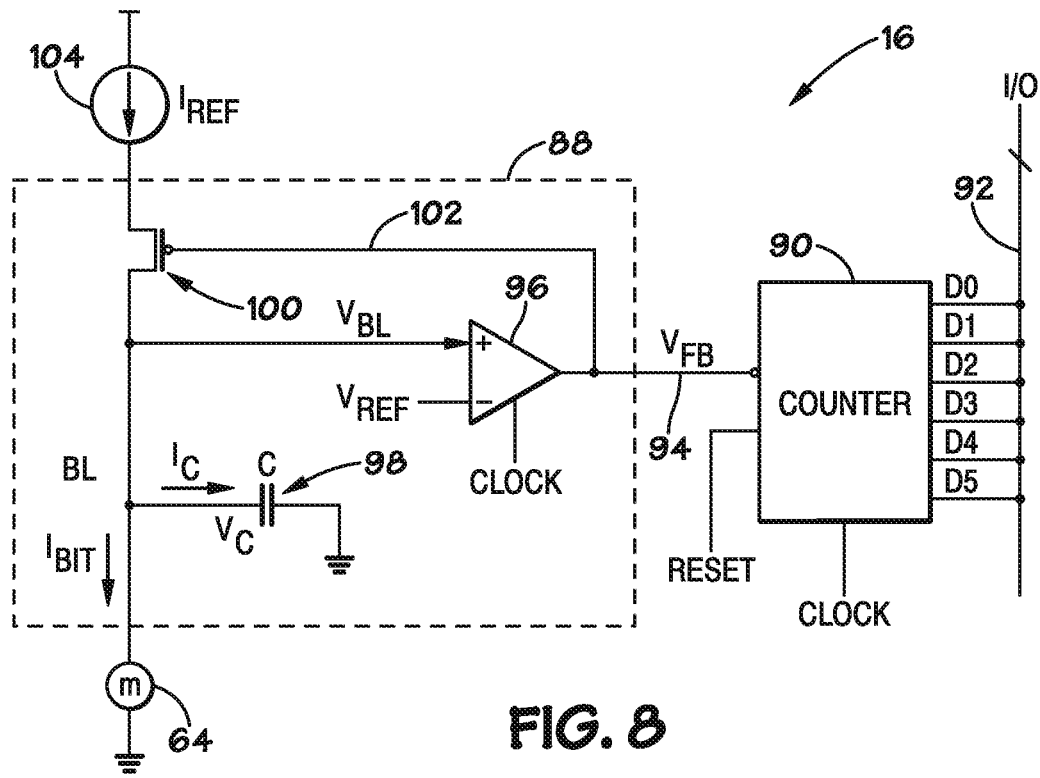
FIG. 8 illustrates a delta-sigma sensing circuit in accordance with an embodiment of the present invention.

FIG. 8 illustrates details of one implementation of the quantizing circuit 16. In this embodiment, the digital filter 90 is a counter, and the analog-to-digital converter 88 is a first-order delta-sigma modulator. The illustrated delta-sigma modulator 88 may include a latched comparator 96 (hereinafter the "comparator"), a capacitor 98, and a switch 100. In other embodiments, other types of digital filters and analog-to-digital converters may be employed, such as those described below in reference to FIGS. 17 and 18.

As illustrated, an input of the counter 90 may connect to the bit-stream signal path 94, which may connect to an output of the comparator 96. The output of the comparator 96 may also connect to a gate of the switch 100 by a feedback signal path 102. The output terminal (e.g., source or drain) of the switch 100 may connect in series to one of the bit-lines 38, 40, 42, 44, or 46, and the input terminal of the switch 100 may connect to a reference current source 104 ($I_{Ref}$). One plate of the capacitor 98 may connect to one of the bit-lines 38, 40, 42, 44, or 46, and the other plate of the capacitor 98 may connect to ground.

The illustrated counter 90 counts the number of clock cycles that the bit-stream 94 is at a logic high value or logic low value during the sampling period. The counter may count up or count down, depending on the embodiment. In some embodiments, the counter 90 may do both, counting up one for each clock cycle that the bit-stream has a logic high value and down one for each clock cycle that the bit-stream has a logic low value. Output terminals (D0-D5) of the counter 90 may connect to the input/output bus 92 for transmitting the count. The counter 90 may be configured to be reset to zero or some other value when a reset signal is asserted. In some embodiments, the counter 90 may be a series connection of D-flip flops, e.g., D-flip flops having SRAM or other memory for storing an initial value and/or values to be written to the memory element 64.

In the illustrated embodiment, the clocked comparator 96 compares a reference voltage ($V_{Ref}$) to the voltage of one of the bit-lines 38, 40, 42, 44, or 46 ($V_{BL}$), which may be generally equal to the voltage of one plate of the capacitor 98. The comparator 96 may be clocked (e.g., falling and/or rising edge triggered), and the comparison may be performed at regular intervals based on the clock signal, e.g., once per clock cycle. Additionally, the comparator 96 may latch, i.e., continue to output, values ($V_{FB}$) between comparisons. Thus, when the clock signals the comparator 96 to perform a comparison, if $V_{BL}$ is less than $V_{Ref}$, then the comparator 96 may latch its output to a logic low value, as described below in reference to FIG. 9. Conversely, if $V_{BL}$ is greater than $V_{Ref}$, then the comparator 96 may latch a logic high value on its output, as described below in reference to FIG. 10. As a result, the illustrated comparator 96 outputs a bit-stream that indicates whether $V_{BL}$ is larger than $V_{Ref}$, where the indication is updated once per clock cycle.

Advantageously, in some embodiments, the quantizing circuit 16 may include a single comparator (e.g., not more than one) for each column of multi-level memory elements 64. In contrast, conventional sense amplifiers often include multiple comparators to read from a multi-bit memory cell, thereby potentially increasing device complexity and cost.

The capacitor 98 may be formed by capacitive coupling of the bit-lines 38, 40, 42, 44, and 46. In other designs, this type of capacitance is referred to as parasitic capacitance because it often hinders the operation of the device. However, in this embodiment, the capacitor 98 may be used to integrate differences between currents on the bit-lines 38, 40, 42, 44, or 46 and the reference current to form the bit-stream, as explained further below. In some embodiments, the capacitor 98 may be supplemented or replaced with an integrated capacitor that provides greater capacitance than the "parasitic" bit-line capacitance.

Figure 9:
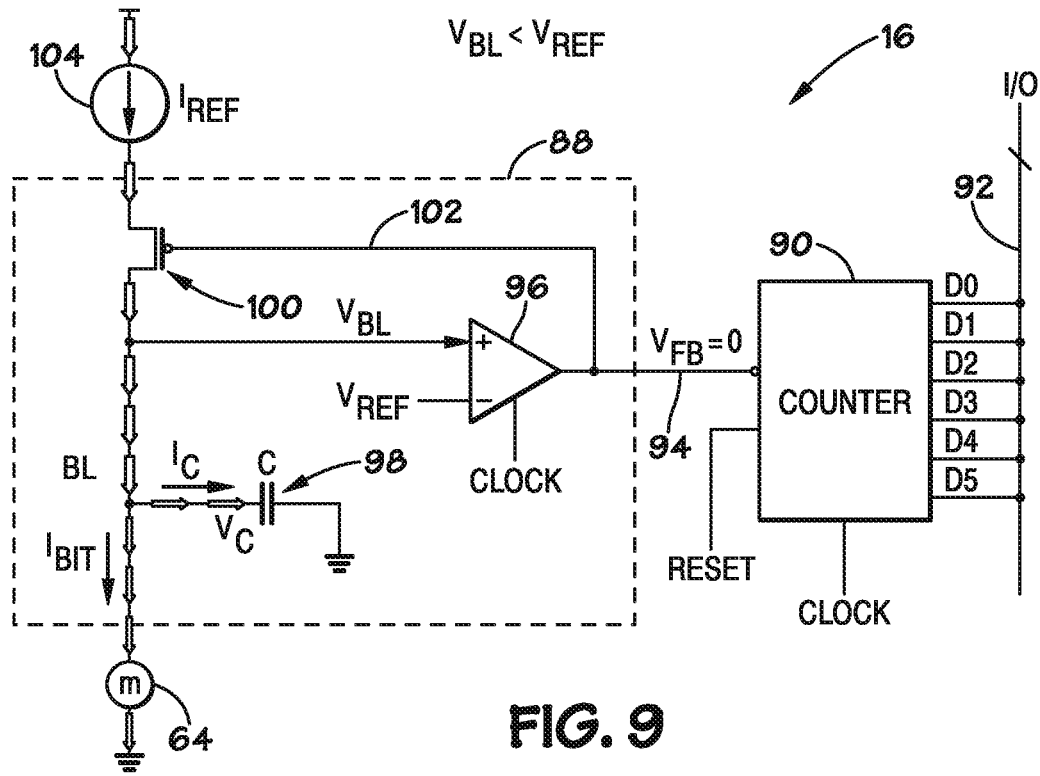
FIGS. 9 and 10 illustrate current flow during operation of the quantizing circuit of FIG. 8.
Figure 10:
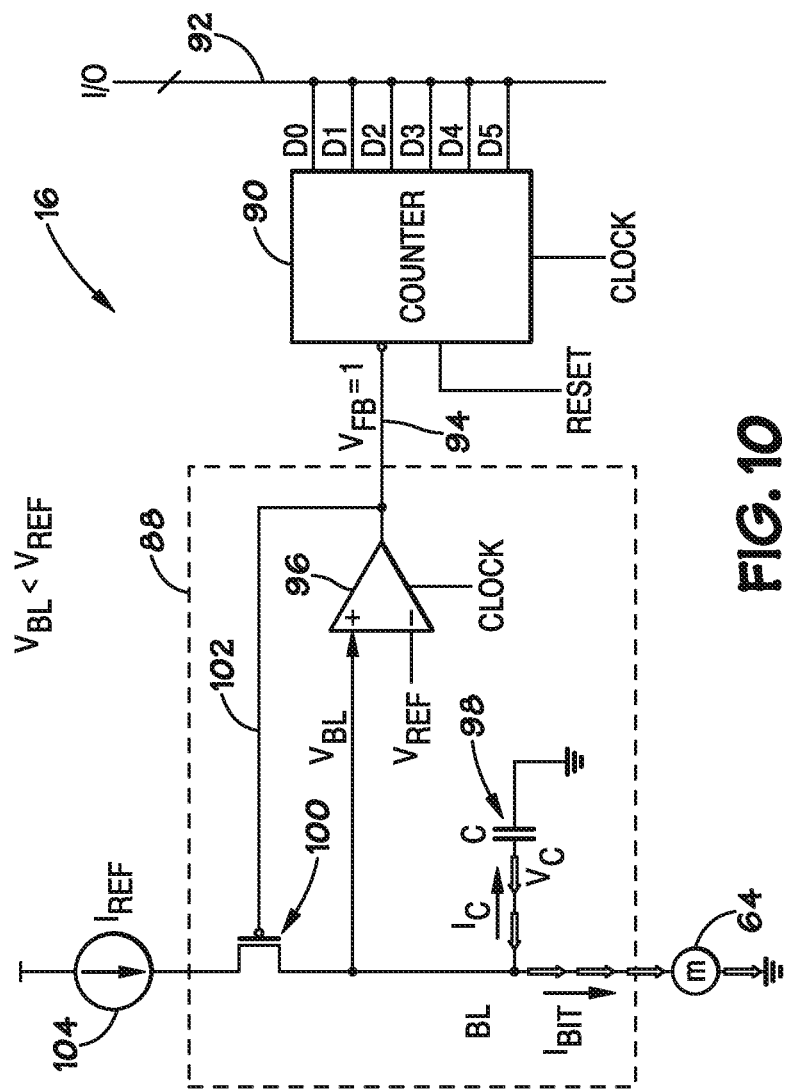
Figure 17:
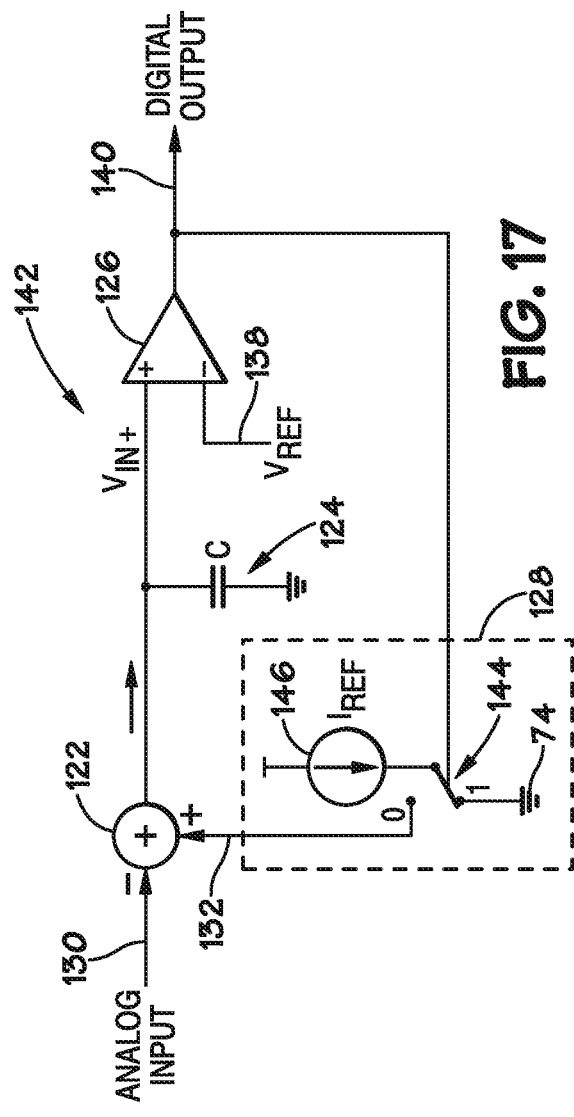
FIG. 17 is a block diagram of a one-bit delta-sigma modulator in accordance with an embodiment of the present invention.

The illustrated switch 100 selectively transmits current $I_{Ref}$ from the reference current source 104. In various embodiments, the switch 100 may be a PMOS transistor (as illustrated in FIGS. 8-10) or an NMOS transistor (as illustrated in FIG. 17) controlled by the $V_{FB}$ signal on the feedback signal path 102.

Figure 11:
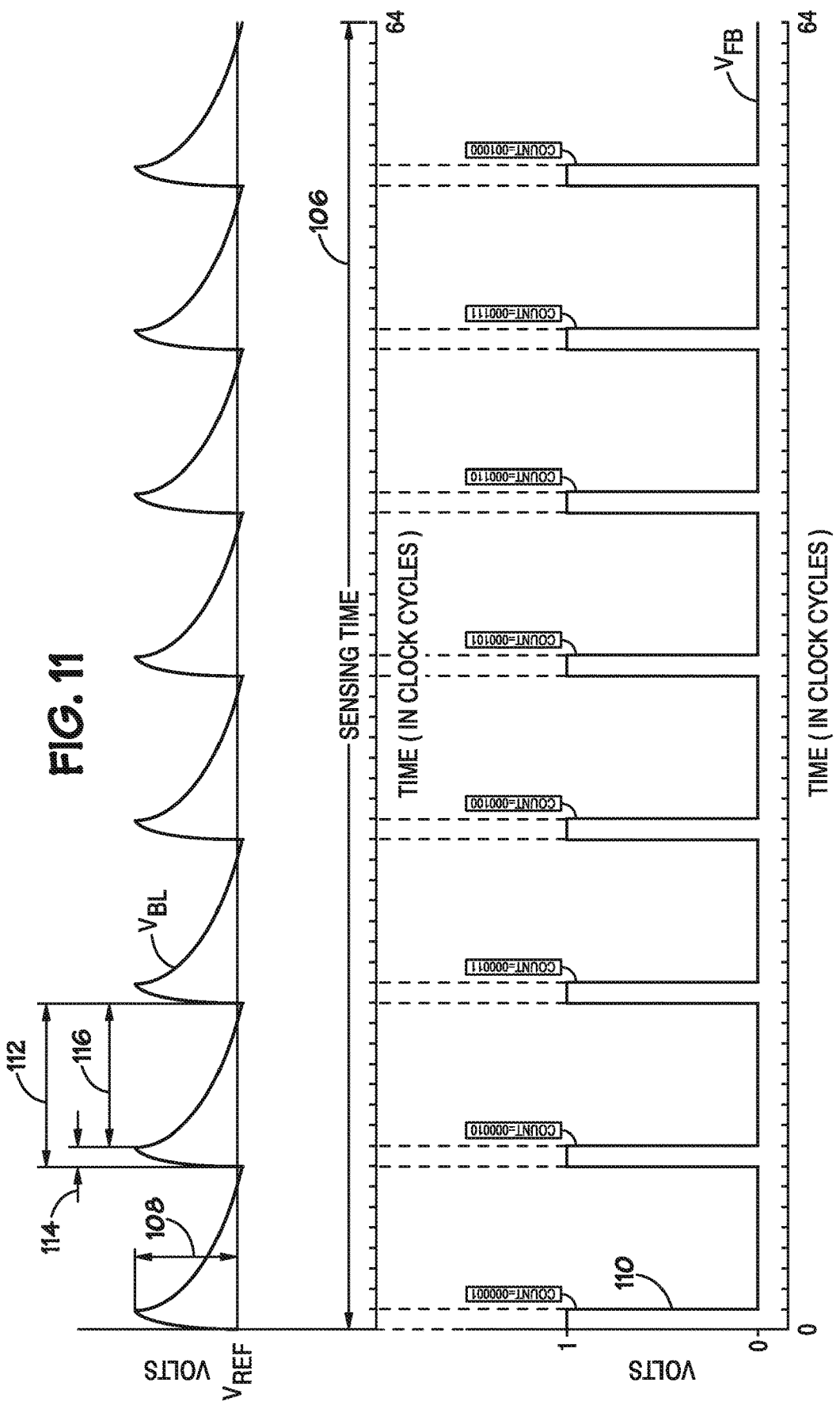
FIGS. 11-13 illustrate voltages in the quantizing circuit of FIG. 8 when sensing small, medium, and large currents, respectively.
Figure 12:
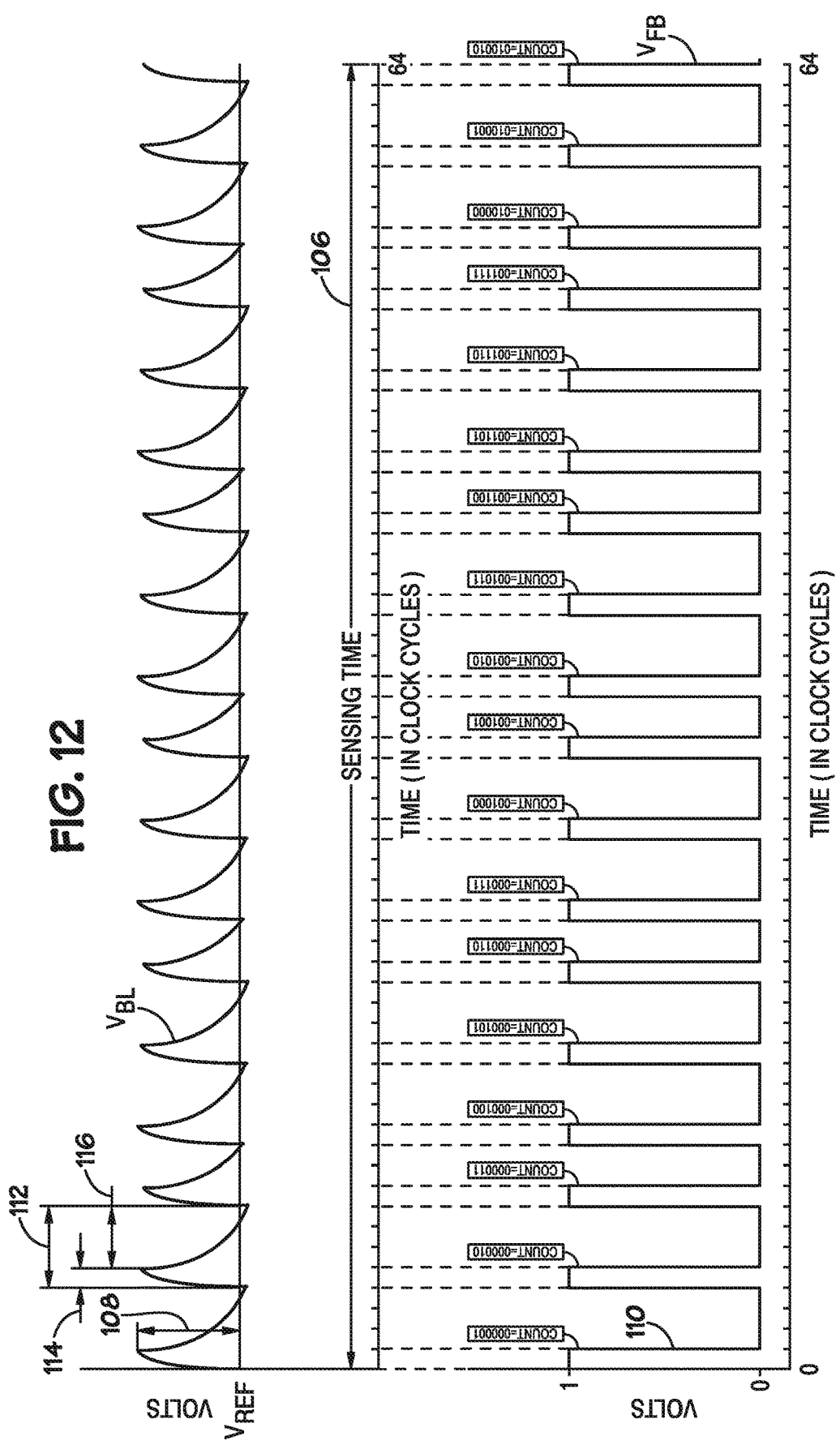
Figure 13:
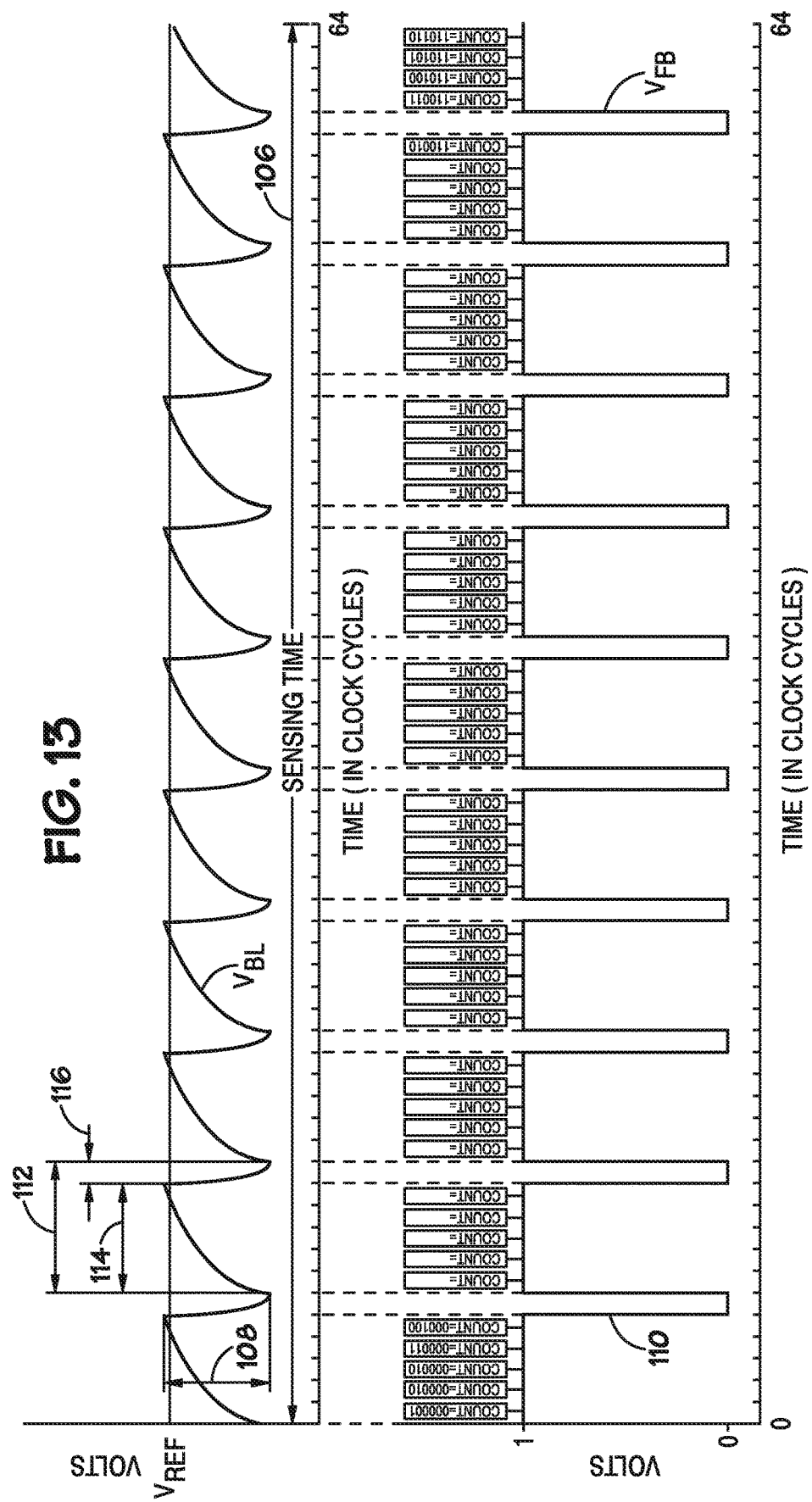

The operation of the quantizing circuit 16 will now be described with reference to FIGS. 9-12. Specifically, FIGS. 9 and 10 depict current flows in the quantizing circuit 16 when the comparator 96 is latched low and high, respectively. FIG. 11 illustrates $V_{BL}$, the bit-stream output from the comparator 96, and the corresponding increasing count of the counter 90 for a relatively small bit-line current. FIG. 12 depicts the same voltages when measuring a medium sized bit-line current, and FIG. 13 depicts these voltages when measuring a relatively large bit-line current.

To measure the current through the memory element 64, the illustrated delta-sigma modulator 88 exploits transient effects to generate a bit-stream representative of the bit-line current $I_{BIT}$. Specifically, the delta-sigma modulator 88 may repeatedly charge and discharge the capacitor 98 with a current divider that subtracts the bit-line current $I_{BIT}$ from the reference current $I_{REF}$. Consequently, a large current through the memory element 64 may rapidly discharge the capacitor 98, and a small current through the memory element 64 may slowly discharge the capacitor 98.

To charge and discharge the capacitor 98, the delta-sigma modulator 88 switches between two states: the state depicted by FIG. 9 (hereinafter "the charging state") and the state depicted by FIG. 10 (hereinafter "the discharging state"). Each time the delta-sigma modulator 88 changes between these states, the bit-stream changes from a logic high value to a logic low value or vice versa. The proportion of time that the delta-sigma modulator 88 is in the state illustrated by either FIG. 9 or FIG. 10 may be proportional to the size of the bit-line current $I_{BIT}$ through the memory element 64. The larger the bit-line current $I_{BIT}$, the more time that the delta-sigma modulator 88 is in the state illustrated by FIG. 9, rather than the state illustrated by FIG. 10, and the more time that the bit-stream has a logic low value.

Starting with the charging state (FIG. 9), the capacitor 98 may initially accumulate a charge. To this end, the output of the comparator 96 is latched to logic low, which, as mentioned above, may occur when $V_{BL}$ is less than $V_{Ref}$. The logic low may be conveyed to switch 100 by the feedback signal path 102, and the switch 100 may close, thereby conducting the reference current $I_{Ref}$ through one of the bit-lines 38, 40, 42, 44, or 46, as indicated by the larger arrows in FIG. 9. A portion of the electrons flowing through the reference current source 104 may be stored by the capacitor 98, as indicated by the smaller-horizontal arrows, and the remainder may be conducted through the memory element 64, i.e., the bit-line current $I_{Bit}$, as indicated by the smaller vertical arrows. Thus, the capacitor 98 may accumulate a charge, and $V_{BL}$ may increase.

The comparator 96 and the reference current source 104 may cooperate to charge the capacitor 98 for a discrete number of clock cycles. That is, when the delta-sigma modulator 88 enters the charging state, the delta-sigma modulator 88 may remain in this state for an integer number of clock cycles. In the illustrated embodiment, the comparator 96, the output of which is latched, changes state no more than once per clock cycle, so the switch 100, which is controlled by the output of the comparator 96, $V_{FB}$, conducts current for a discrete number of clock cycles. As a result, the reference current source 104 conducts current $I_{Ref}$ through the bit-line and into the capacitor 98 for an integer number of clock cycles.

After each clock cycle of charging the capacitor 98, the delta-sigma modulator 88 may transition from the charging state to the discharging state, which is illustrated by FIG. 10, depending on the relative values of $V_{BL}$ and $V_{Ref}$. Once per clock cycle (or at some other appropriate interval, such as twice per clock cycle), the comparator 96 may compare the voltage of the capacitor $V_{BL}$ to the reference voltage $V_{Ref}$. If the capacitor 98 has been charged to the point that $V_{BL}$ is greater than $V_{Ref}$, then the output of the comparator 96 may transition to logic high, as illustrated in FIG. 10. The logic high signal may be conveyed to the switch 100 by the feedback signal path 102, thereby opening the switch 100. As a result, the reference current source 104 may cease flowing current through the memory element 64 and into the capacitor 98, and the capacitor 98 may begin to discharge through the memory element 64.

In the present embodiment, the delta-sigma modulator 88 discharges the capacitor 98 for a discrete number of clock intervals. After each clock cycle of discharging the capacitor 98, the delta-sigma modulator 88 compares $V_{BL}$ to $V_{Ref}$. If $V_{BL}$ is still greater than $V_{Ref}$, then the comparator 96 may continue to output a logic high signal, i.e., $V_{FB}=1$, and the switch 100 remains open. On the other hand, if enough current has flowed out of the capacitor 98 that $V_{BL}$ is less than $V_{Ref}$, then the comparator 96 may output a logic low signal, i.e., $V_{FB}=0$, and the switch 100 may close, thereby transitioning the delta-sigma modulator 88 back to the charging state and initiating a new cycle.

The counter 90 may count the number of clock cycles that the delta-sigma modulator 88 is in either the charging state or the discharging state by monitoring the bit-stream signal path 94. The bit-stream signal path 94 may transition back and forth between logic high and logic low with the output of the comparator 96, $V_{FB}$, and the counter 90 may increment and/or decrement a count once per clock cycle (or other appropriate interval) based on whether the bit-stream is logic high or logic low. After the sensing time has passed, the counter 90 may output a signal indicative of the count on output terminals D0-D5. As explained below, the count may correspond, e.g., proportionally, to the bit-line current, $I_{Bit}$.

FIGS. 11-13 illustrate voltages $V_{FB}$ and $V_{BL}$ in the quantizing circuit 16 when reading a memory element 64. Specifically, FIG. 11 illustrates a low-current case, in which the value stored by the memory element 64 corresponds to a relatively low bit-line current. Similarly, FIG. 12 illustrates a medium-current case, and FIG. 13 illustrates a high-current case. In each of these figures, the ordinate of the lower trace represents the voltage of the bit-stream signal path 94, $V_{FB}$, and the ordinate of the upper trace illustrates the bit-line voltage, $V_{BL}$. The abscissa in each of the traces represents time, with the lower trace synchronized with the upper trace, and the duration of the time axes is one sensing time 106.

As illustrated by FIG. 11, the counter 90 is initially set to zero (or some other appropriate value) by asserting a reset signal. In some embodiments, the delta-sigma modulator 88 may undergo a number of start-up cycles to reach steady-state operation before initiating the sensing time and resetting the counter 90. At the beginning of the illustrated read operation, the delta-sigma modulator 88 is in the charging state, which charges the capacitor 98 and increases $V_{BL}$, as indicated by dimension arrow 108. At the beginning of the next clock cycle, the comparator 96 compares the bit-line voltage to the reference voltage and determines that the bit-line voltage is greater than the reference voltage. As a result, the bit-stream signal path 94 ($V_{FB}$) transitions to a logic high voltage, and the delta-sigma modulator 88 transitions to the discharging state. Additionally, the counter 90 increments the count by one to account for one clock cycle of the bit-stream signal 94 holding a logic low value. Next, the charge stored on the capacitor 98 drains out through the memory element 64, and the bit-line voltage drops until the comparator 96 detects that $V_{BL}$ is less than $V_{Ref}$, at which point the cycle repeats. The cycle has a period 112, which may be divided into a charging portion 114 and a discharging portion 116. Once during each cycle in the sensing time 106, the count stored in the counter 90 may increase by one. At the end of the sensing time 106, the counter 90 may output the total count.

A comparison of FIG. 11 to FIGS. 12 and 13 illustrates why the count correlates with the bit-line current. In FIG. 13, the high-current case, the stored charge drains from the capacitor 98 quickly, relative to the other cases, because the bit-line current $I_{BIT}$ is large and, as a result, the delta-sigma modulator 88 spends more time in the charging state than the discharging state. As a result, the bit-stream has a logic low value for a large portion of the sensing time 106, thereby increasing the count.

The capacitance of the capacitor 98 may be selected with both the clock frequency and the range of expected bit-line currents in mind. For example, the capacitor 98 may be large enough that the capacitor 98 does not fully discharge or saturate when the bit-line current $I_{BIT}$ is either at its lowest expected value or at its highest expected value. That is, in some embodiments, the capacitor 98 generally remains in a transient state while reading the memory element 64. Similarly, the frequency at which the comparator 96 is clocked may affect the design of the capacitor 98. A relatively high frequency clock signal may leave the capacitor 98 with relatively little time to discharge or saturate between clock cycles, thereby leading a designer to choose a smaller capacitor 98.

Similarly, the size of the reference current may be selected with the range of expected bit-line currents in mind. Specifically, in certain embodiments, the reference current is less than the largest expected bit-line current $I_{BIT}$, so that, in the case of maximum bit-line current $I_{BIT}$, the capacitor 98 can draw charge from the reference current while the rest of the reference current flows through the memory element 64.

Figure 14:
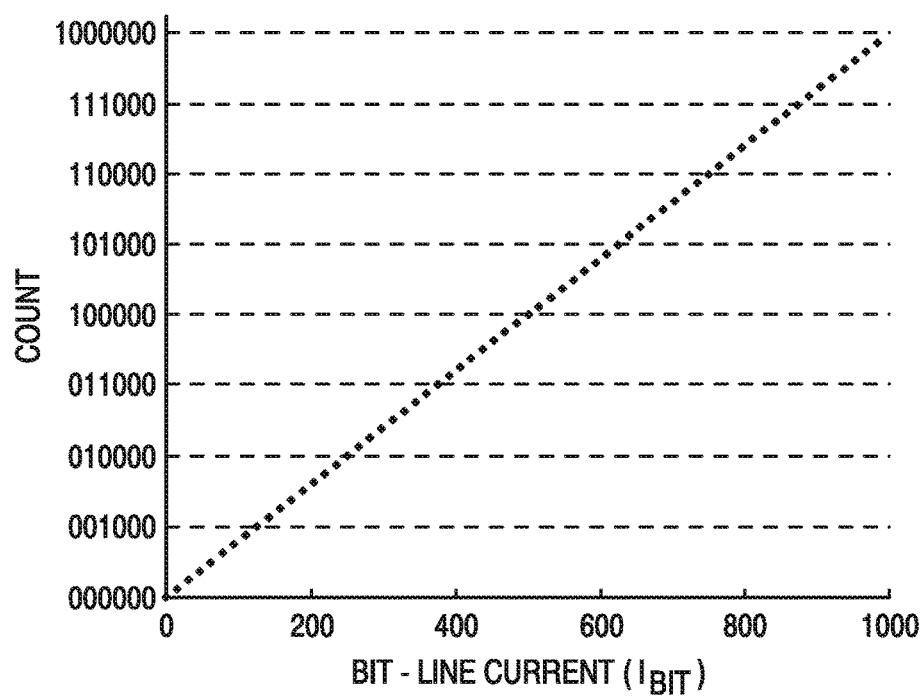
FIG. 14 is a graph of bit-line current versus counter output for the quantizing circuit of FIG. 8.

FIG. 14 illustrates the relationship between the bit-line current $I_{BIT}$ and the count for the presently discussed embodiment. As illustrated by FIG. 14, the count is generally proportional to the bit-line current $I_{BIT}$. This relationship is described by the following equation (Equation 1), in which $N_{ST}$ represents the number of clock cycles during the sensing time:

$$I_{Bit}/I_{Ref} = \text{Count}/N_{ST}$$

Thus, in the illustrated embodiment, the count is indicative of the bit-line current $I_{BIT}$, which is indicative of the value stored by the memory element 64.

Advantageously, the quantizing circuit 16 may categorize the bit-line current $I_{BIT}$ as falling into one of a large number of categories, each of which is represented by an increment of the count. That is, the quantizing circuit 16 may resolve small differences in the bit-line current $I_{BIT}$. The resolution of the quantizing circuit 16 may be characterized by the following equation (Equation 2), in which $I_{MR}$ represents the smallest resolvable difference in bit-line current $I_{BIT}$, i.e., the resolution of the quantizing circuit 16:

$$I_{MR} = I_{Ref}/N_{ST}$$

Thus, the resolution of the quantizing circuit 16 may be increased by increasing the sensing time or the clock frequency or by decreasing $I_{Ref}$, which may limit the maximum cell current since $I_{MR}$ is less than $I_{Ref}$.

The resolution of the quantizing circuit 16 may facilitate storing multiple bits in the memory element 64 or detecting multiple levels of light intensity in an image sensor element. For example, if the quantizing circuit 16 is configured to categorize the bit-line current $I_{BIT}$ into one of four different levels, then the memory element 64 may store two-bits of data or, if the quantizing circuit 16 is configured to categorize the bit-line current $I_{BIT}$ into one of eight different current levels, then the memory element 64 may store three-bits of data. For the present embodiment, the number of bits stored by the memory element 64 may be characterized by the following equation (Equation 3), in which $N_B$ represents the number of bits stored by a memory element 64 and $I_{Range}$ represents the range of programmable bit-line currents through the memory element 64:

$$N_B = \log(I_{Range}/I_{MR})/\log 2$$

In short, in the present embodiment, greater resolution translates into higher density data storage for a given memory element 64.

Figure 15:
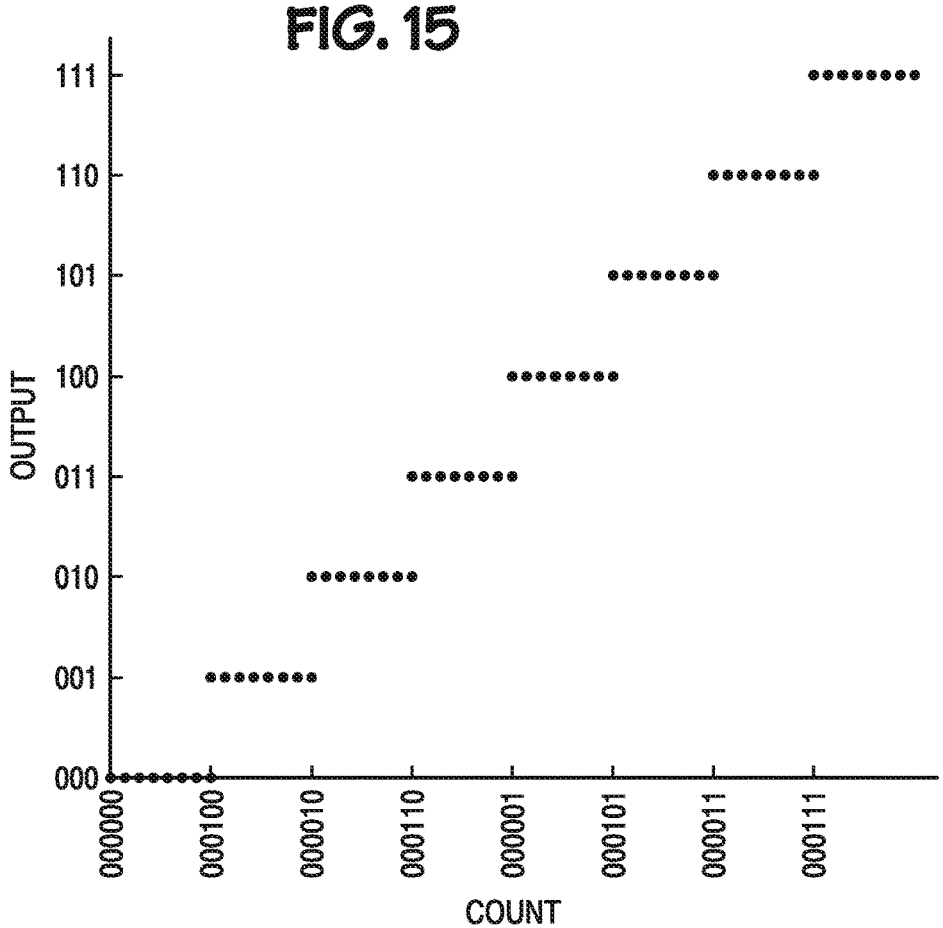
FIG. 15 is a graph of count versus quantizing circuit output in accordance with an embodiment of the present invention.

FIG. 15 is a graph that illustrates one way in which the counter 90 may be configured to further reduce the effects of noise. In FIG. 15, the abscissa represents the count, and the ordinate represents the output of the quantizing circuit 16. In the present embodiment, the three-least-significant digits of the count are disregarded as potentially corrupted by noise. That is, D0-D2 (FIG. 8) either do not connect to the input/output bus 92 or are not interpreted as conveying data that is stored by the memory element 64. As a result, a range of counter values may represent a single data value stored by the memory element 64. For example, in the present embodiment, count values ranging from 00 1000 to 00 1111 are construed as representing a data value of 001. Representing data in this manner may further reduce the effects of noise because, even if noise affects the count, in many embodiments, it would have to affect the count in a consistent manner over a substantial portion of the sensing time to affect the more significant digits of the count. That is, disregarding less significant digits may lower the cutoff frequency of the counter 90. In other embodiments, fewer, more, or no digits may be truncated from the count as potentially representing noise.

Truncating less significant digits may introduce a rounding error, or a downward bias, in the output. This effect may be mitigated by presetting the counter 90 in a manner that accounts for this bias. The counter 90 may be present either before reading from the memory element 64 or before writing to the memory element 64. In some embodiments, the preset value may be one-half of the size of the range of counter values that represent a single output value. In other words, if m digits are truncated from the output, then the counter 90 may be preset to one-half of $2^m$ before reading from a memory element 64 or before writing to the memory element 64. In some embodiments, the memory 91 may store this preset value.

Figure 16:
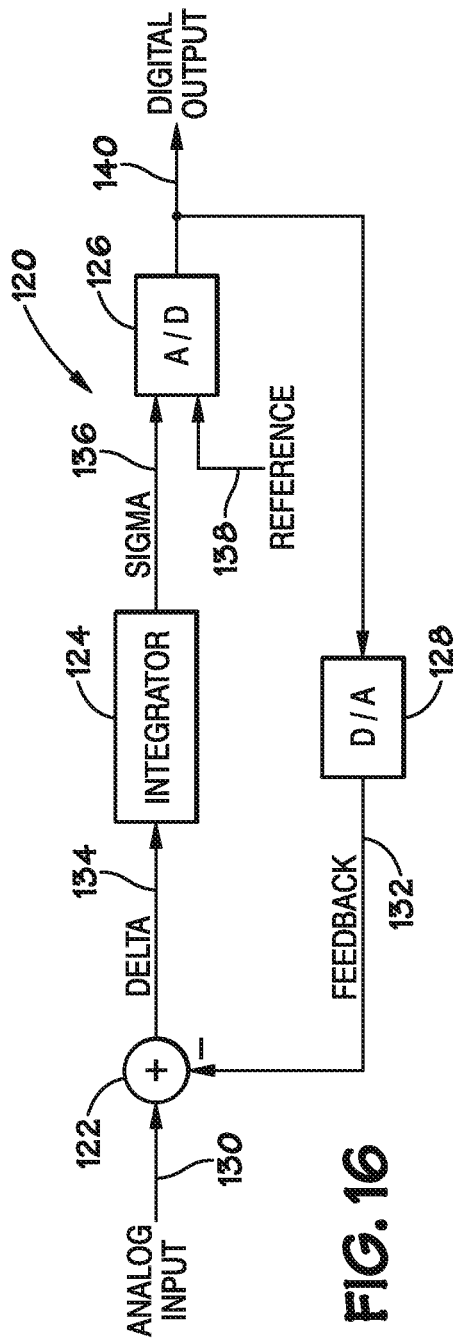
FIG. 16 is a block diagram of a delta-sigma modulator in accordance with an embodiment of the present invention.

Delta-sigma modulators may be formed with a variety of circuit topologies. A broad array of these topologies is illustrated by FIG. 16, which is a block diagram of an example of a first-order delta-sigma modulator 120. As described below, the embodiment of FIG. 16 is generic to the delta-sigma modulator 88 illustrated in FIG. 8. The illustrated delta-sigma modulator 120 includes an adder 122, an integrator 124, an analog-to-digital converter (A/D) 126, and a digital-to-analog converter (D/A) 128. The illustrated adder 122 receives an analog input signal 130 and a feedback signal 132 from the digital-to-analog converter 128. The illustrated adder 122 outputs a delta signal 134 to an input of the integrator 124, which outputs a sigma signal 136 to an input of the analog-to-digital converter 126. The analog-to-digital converter 126 also receives a reference signal 138. The analog-to-digital converter 126 outputs a digital output signal 140, which is received by an input to the digital-to-analog converter 128.

FIG. 17 is a block diagram of an example of a one-bit delta-sigma modulator 142, which is an embodiment of the delta-sigma modulator 120 illustrated by FIG. 16, and which generic to the delta-sigma modulator 88 illustrated by FIG. 8. In this example, the integrator 124 is a capacitor and the analog-to-digital converter 126 is a comparator. The reference signal 138 is a voltage $V_{REF}$, and the digital-to-analog converter 128 includes a switch 144 and a reference current source 146.

In operation, the illustrated delta-sigma modulator 142 measures the analog input signal 130 by integrating a difference between the analog input signal and the feedback signal 132 and exercising feedback control over this integrated difference. The greater the difference, the stronger or the more frequent the feedback signal 132. The analog signals may be voltage signal or current signals. Examples that integrate a difference in analog voltage signals are described below. Previously, an example of an analog current signal was described in reference to FIG. 8. In this embodiment, the difference between the bit-line current $I_{Bit}$ and the reference current $I_{Ref}$ is integrated by the voltage of the capacitor 98, and the comparator 96 controls this voltage by outputting feedback on the feedback signal path 102. In certain embodiments, if the strength of the feedback signal is held relatively constant when it is applied, the proportion of time that the feedback signal is applied is indicative of the analog input signal 130. Thus, consistently applying a feedback signal of the same strength may improve the correlation between the digital output 140 and the analog input 130, thereby potentially improving the accuracy of the quantizing circuit 16.

The following figures illustrate embodiments of the adder 122 and the digital-to-analog converter 128 that may apply the feedback signal 132 in a relatively consistent manner. FIGS. 18-22 illustrate adders configured to add the analog input signal 130 and the feedback signal 132 (or its inverse), where the analog input signal 130 and/or the feedback signal 132 is a voltage, and FIGS. 23-29 illustrate examples of the digital-to-analog converter 128. Some of the following embodiments are believed to improve the precision of the delta-sigma modulators 120 and/or 142 and/or lower the power consumption of these components relative to conventional designs, as described below.

FIG. 18 illustrates a first embodiment of the adder 122 of FIGS. 16 and 17. This embodiment is designated with reference number 148. The illustrated adder 148 includes voltage-to-current converters 150 and 152. In the present embodiment, the input terminal of the voltage-to-current converter 150 is connected to an analog input signal $V_{IN\text{-}Analog}$, and the input terminal of the voltage-to-current converter 152 is connected to a voltage feedback signal $V_{Feedback}$. Details of examples of voltage-to-current converters are described below with reference to the FIGS. 19 and 20. In operation, the voltage-to-current converter 150 may convert $V_{IN\text{-}Analog}$ to a current $I_{in}$, and the voltage-to-current converter 152 may convert $V_{Feedback}$ to a current $I_f$. The output terminals of the voltage-to-current converters 150 and 152 may be coupled to one another and an adder output $I_{in}+I_f$. Thus, the adder 148 may be configured to convert voltage signals to currents and combine those currents.

In other embodiments, the adder 148 may convert only one voltage signal to a current and combine that current with another signal that is already in the form of a current. Also, in some embodiments, the current outputs from the voltage-to-current converters $I_{in}$ and $I_f$ may have different signs, and the adder 148 may output a difference of these currents, i.e., the adder 148 may also subtract.

FIG. 19 illustrates an example of a voltage-to-current converter 154, which may embody one or both of the voltage-to-current converters 150 and 152 illustrated in FIG. 18. In this example, the voltage-to-current converter 154 includes an NMOS transistor 156 and a resistor 158. The resistor 158 may be disposed in series between ground 74 and the source of the transistor 156, and an input voltage $V_{IN}$, such as $V_{IN\text{-}Analog}$ or $V_{feedback}$ in FIG. 18, may connect to the gate of the transistor 156. In the present embodiment, the transistor 156 has a gate width sized such that a voltage difference between the gate and the source $V_{GS}$ is near the threshold voltage of the transistor $V_{THN}$. Consequently, in certain embodiments, the transistor 156 operates in the linear region of its I-V curve. As a result, in some embodiments, the operation of the voltage-to-current converter 154 may be characterized by the following equation (Equation 4), in which I corresponds to the output current signal and R corresponds to the resistance of the resistor 158:

$$I=(V_{IN}-V_{THN})/R$$

FIG. 20 illustrates another example of a voltage-to-current converter 160, which may embody one or both of the voltage-to-current converters 150 and 152 illustrated in FIG. 18. The voltage-to-current converter 160 may include a PMOS transistor 162 (in contrast to the NMOS transistor of the previous embodiment) and a resistor 164, which may be disposed in series between the transistor 162 and a voltage source $V_{DD}$. The transistor 162 may have a relatively wide gate that is sized such that its operation may be described by the following equation (Equation 5), wherein $V_{THP}$ is the threshold voltage of the transistor 162, I is the output current signal, and R is the resistance of the resistor 164:

$$I=(V_{DD}-V_{THP}-V_{IN})/R$$

Figure 21:
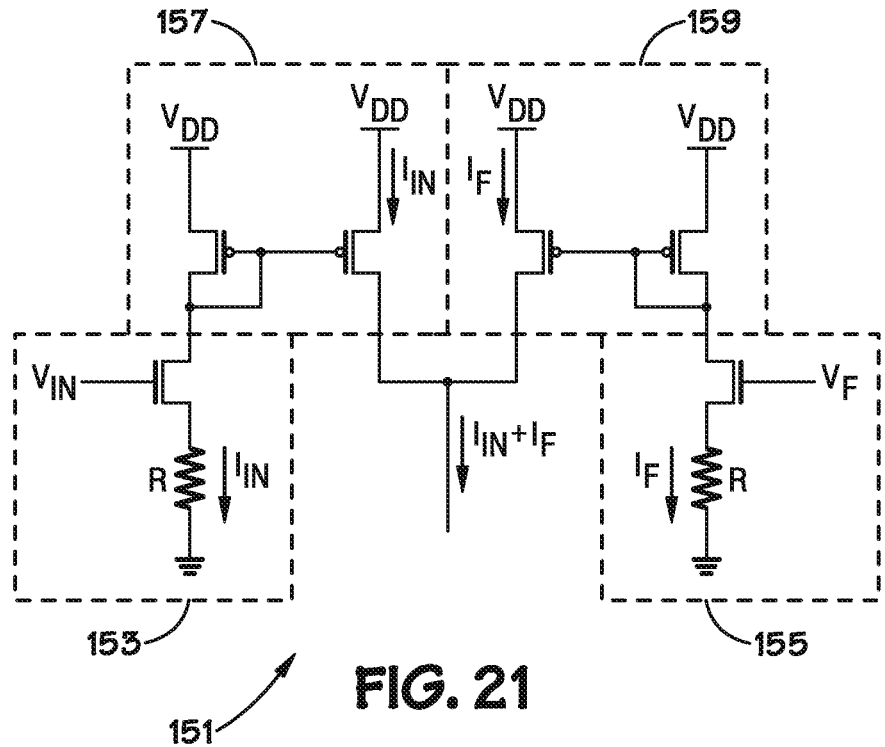
FIGS. 21-22 each illustrate respective examples of the adder illustrated by FIG. 18 in accordance with embodiments of the present invention.
Figure 22:
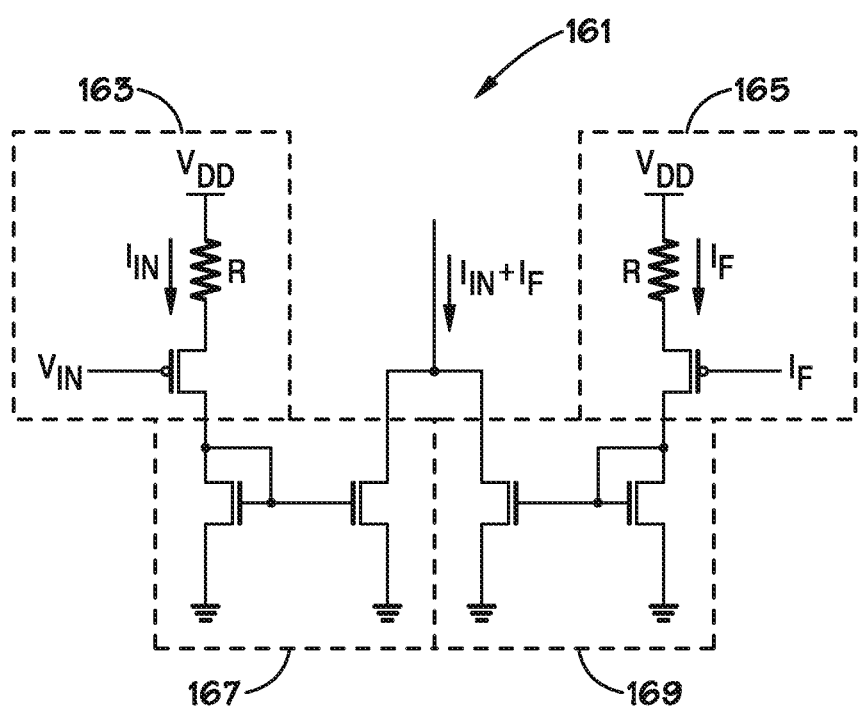

FIGS. 21 and 22 illustrate examples of the adder 148 (FIG. 18) that may employ the voltage-to-current converters 154 and 160 (FIGS. 19 and 20). In FIG. 21, the adder 151 sources the current $I_{IN}+I_F$. The adder 151 may include two voltage-to-current converters 153 and 155, which may correspond to the voltage-to-current converter 154 of FIG. 19, and two current mirrors 157 and 159. In FIG. 22, the adder 161 sinks the current $I_{IN}+I_F$. The adder 161 may include voltage-to-current converters 163 and 165, which may correspond to the voltage-to-current converter 160 of FIG. 20, and two current mirrors 167 and 169.

FIG. 23 illustrates another example of an adder 166, which may embody the adder 122 illustrated in FIGS. 16 and 17. In this embodiment, the adder 166 includes a pair of voltage-to-current converters 168 and 170 that are configured to convert a voltage signal into a current signal that may span two directions of current flow. That is, the output of the voltage-to-current converters $\pm I_{IN}$ and $\pm I_f$ may flow in both directions, depending on the input voltage signal $\pm V_{IN}$ or $\pm V_f$. Consequently, the output $\pm I_{IN} \pm I_f$ may also range over two directions of current flow.

Figure 24:
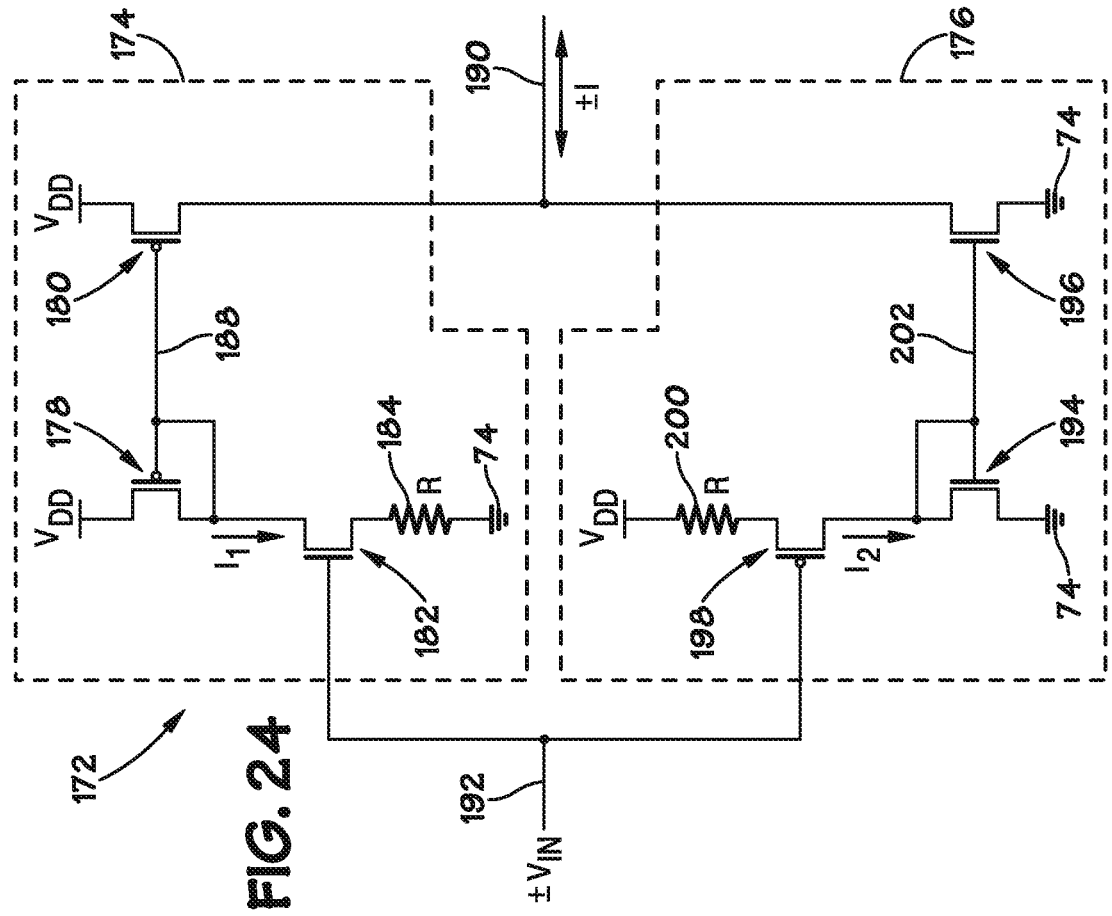
FIG. 24 illustrates a third example of a voltage-to-current converter in accordance with an embodiment of the present invention.

FIG. 24 illustrates a voltage-to-current converter 172, which may embody one or both of the voltage-to-current converters 168 and 170 illustrated in FIG. 23. The present voltage-to-current converter 172 may include a forward-current converter 174 and a reverse-current converter 176.

The forward-current converter 174 may include two-PMOS transistors 178 and 180, an NMOS transistor 182, and a resistor 184. The resistor 184 may be disposed in series between the transistor 182 and ground 74. The transistor 178 may be disposed in series between the voltage source $V_{DD}$ and the transistor 182. The transistors 178 and 180 may share a gate signal 188, which may be coupled to a node in series between the transistors 178 and 182. The transistor 180 may be disposed in series between the voltage source $V_{DD}$ and an output signal path 190, which carries an output current signal $\pm I$. The gate of the transistor 182 may be connected to an input signal path 192, which carries an input voltage signal $\pm V_{IN}$. The transistors 178, 180, and 182 may have relatively wide gate widths, so that, during normal operation, they operate in the linear region of their I-V curves.

Similarly, the reverse-current converter 176 may include two-NMOS transistors 194 and 196, a PMOS transistor 198, and a resistor 200. The resistor 200 may be disposed in series between the voltage source $V_{DD}$ and the transistor 198. The transistor 194 may be disposed in series between ground 74 and the transistor 198. The transistors 194 and 196 may share a gate signal 202, which may be coupled to a node in series between the transistors 198 and 194. The transistor 196 may be disposed in series between ground 74 and the output signal path 190. The gate of transistor 198 may be connected to the input signal path 192. The transistors 198, 194, and 196 may have relatively wide gate widths, so that, during normal operation, they operate in the linear region of their I-V curves.

In operation, either the forward-current converter 174 may act as a current source or the reverse-current converter 176 may act as a current sink, depending on the input voltage signal $\pm V_{IN}$. If the input voltage signal $\pm V_{IN}$ is positive, then the transistor 198 may turn off, and the transistor 182 may turn on. As a result, in some embodiments, a current $I_1$ may flow through the transistor 182, and a current $I_2$ may cease flowing through transistor 198. Because the transistors operate in the linear region of their I-V curve, the magnitude of the currents $I_1$ and $I_2$ may be generally proportional to the magnitude of the input voltage signal $\pm V_{IN}$. The transistors 178 and 180 may mirror the current $I_1$ on the output signal path 190, and the transistors 194 and 196 may mirror the current $I_2$ on the output signal path 190.

Advantageously, the current mirrors formed by the transistors 178, 180, 194, and 196 may form the output current $\pm I$ in a manner that is relatively robust to loads applied to the output signal path 190. As a result, the adder 122 (FIGS. 16 and 17) may receive signals that accurately convey information about the analog input or the state of the delta-sigma modulation circuit 120 or 142, such as the magnitude of an input voltage or a feedback voltage. This is believed to improve the accuracy of the adder.

Figure 25:
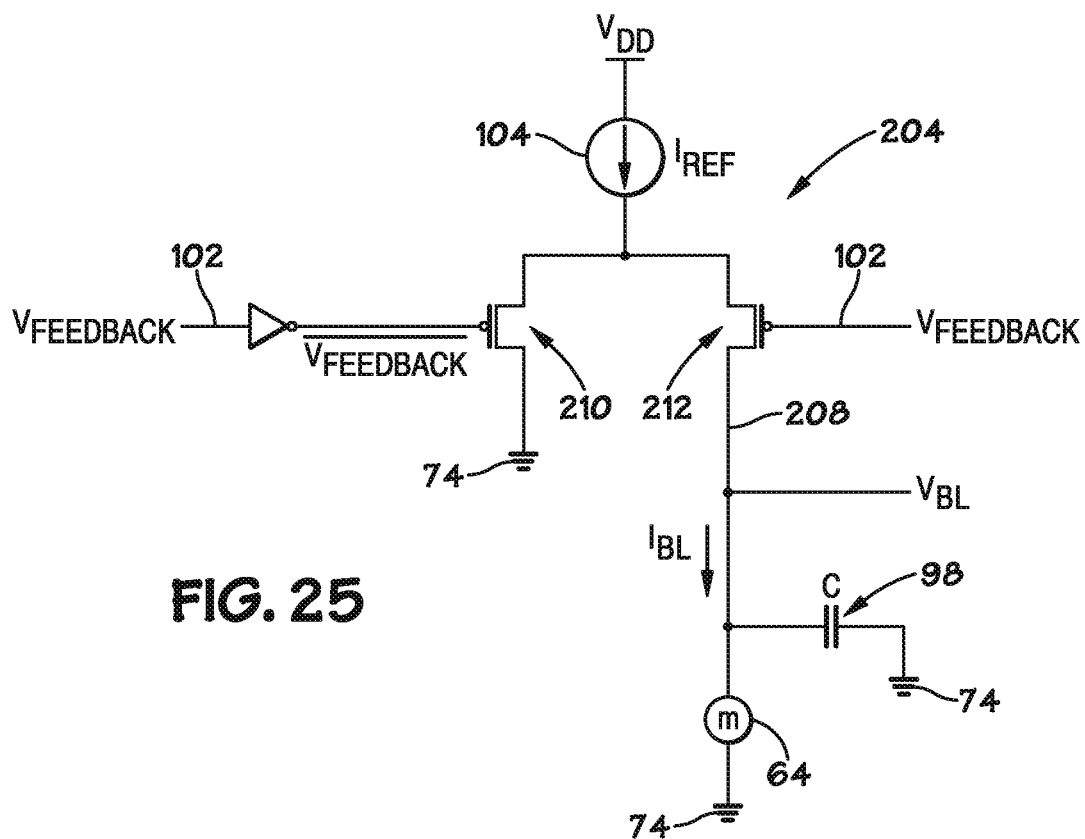

FIG. 25 illustrates an example of a switch 204, which may be employed in place of the current switch 100 in the delta-sigma modulation circuit 88 illustrated by FIG. 8. The illustrated switch 204 routes the reference current $I_{Ref}$ either to ground 74 or to a bit-line 208 based on the feedback signal $V_{feedback}$ from the comparator 96 (FIG. 8) on the feedback signal path 102. In certain embodiments, the switch 204 converts a digital signal from the analog-to-digital converter 126, i.e., a digital feedback signal, to an analog signal, i.e., the reference current. The switch 204 may include two PMOS transistors 210 and 212, the gates of which may be controlled by $V_{feedback}$ or its complement.

Advantageously, the switch 204 may supply a relatively uniform reference current $I_{Ref}$ because of the reference current $I_{Ref}$ flows generally constantly, rather than turning on and off. As a result, transient effects, such as parasitic induction and capacitance, that may distort the reference current $I_{Ref}$ in other designs may be avoided. This is believed to improve the accuracy of the delta-sigma modulator 88 (FIG. 8) because the bit-line current $I_{Bit}$ is measured against, e.g., subtracted from, a relatively constant quantity.

Figure 26:
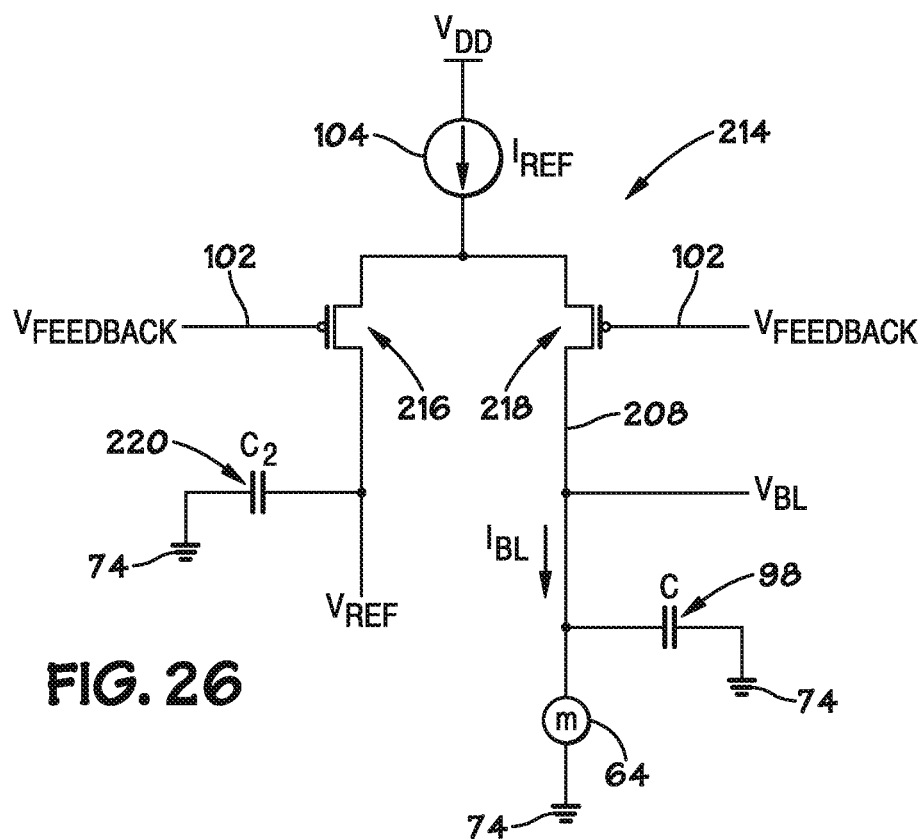

FIG. 26 illustrates another example of a switch 214, which may be employed in place of the current switch 100 in the delta-signal modulation circuit 88 illustrated by FIG. 8. The switch 214 may include PMOS transistors 216 and 218 and a capacitor 220. In the present embodiment, one plate of the capacitor 220 is coupled to ground 74 and the other plate is coupled to both the reference voltage $V_{Ref}$ (which is also coupled to the comparator 96 in FIG. 8) and one terminal of the transistor 216. The other terminal of the transistor 216 may be connected to the reference current source 104 along with one terminal of the transistor 218. The gates of the transistors 216 and 218 may be connected to the feedback signal path 102 to receive $V_{feedback}$.

In operation, the capacitor 220 may supplement the reference current source 104 during transient periods with an elevated load. When the transistors 216 and 218 turn on, and the reference current $I_{Ref}$ begins to flow through the bit-line 208, the reference current source 104 may be unable to supply a uniform current due to parasitic, transient effects. To counteract these transient effects, the reference voltage may maintain a charge on the capacitor 220, which may supply current to the bit-line 208 and the current from the reference current source 104. In other words, the capacitor 220 may store and release energy to average out the load seen by the reference current source 104. As a result, the reference current $I_{Ref}$ may be more uniform, which is believed to improve the accuracy of the delta-sigma modulation circuit 88 (FIG. 8). In certain embodiments, the switch 214 converts a digital signal from the analog-to-digital converter 126 to an analog signal.

Figure 27:
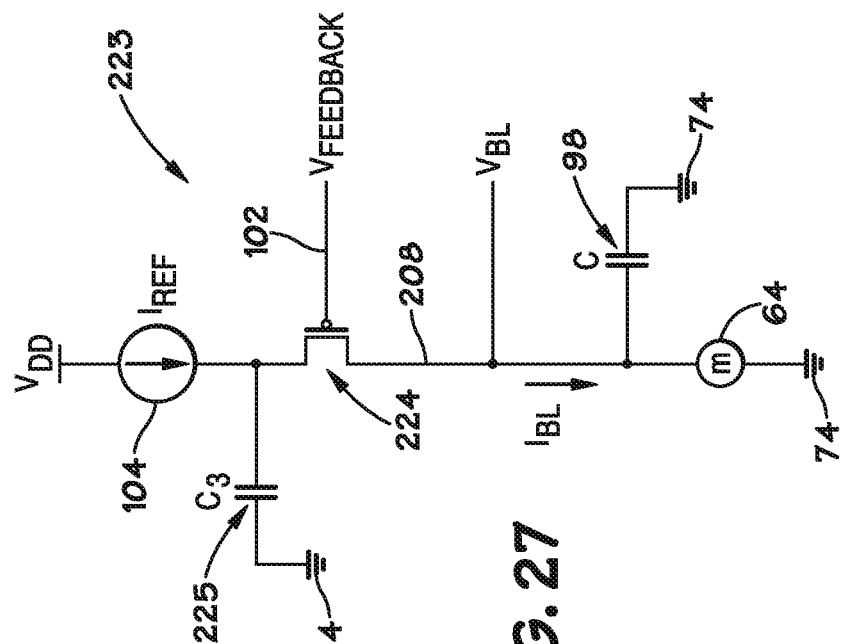
FIGS. 25-27 each illustrate respective examples of a current switch in accordance with an embodiment of the present invention.

FIG. 27 illustrates another example of a switch 223, which may be employed in place of the current switch 100 in the delta-signal modulation circuit 88 illustrated by FIG. 8. The illustrated switch 223 includes a PMOS transistor 224 and a capacitor 225. One terminal of the transistor 224 may be connected to one plate of the capacitor 225 and the reference current source 104. The other terminal of the transistor 224 may be connected to the bit-line 208, and the gate of the transistor 224 may be connected to the feedback signal path 102 to receive $V_{feedback}$ from the comparator 96 (FIG. 8). One plate of the capacitor 225 may also be connected to ground.

In operation, the capacitor 225 may deliver supplemental power to the reference current source 104. When the transistor 224 turns on or off, the load on the reference current source 104 may spike, thereby potentially disrupting the reference current her. To counteract this effect, the capacitor 225 may store charge from the reference current $I_{ref}$ when the transistor 224 is turned off, and a release that charge through the bit-line 208 when the transistor 224 turns on. In certain embodiments, the switch 223 converts a digital signal from the analog-to-digital converter 126 to an analog signal. Advantageously, the switch 223 may provide a relatively stable reference current $I_{Ref}$. Additionally, in the present embodiment, the switch 223 consumes relatively little power because the reference current $I_{Ref}$ does not flow to ground 74 when it is not flowing through the bit-line 208.

Figure 28:
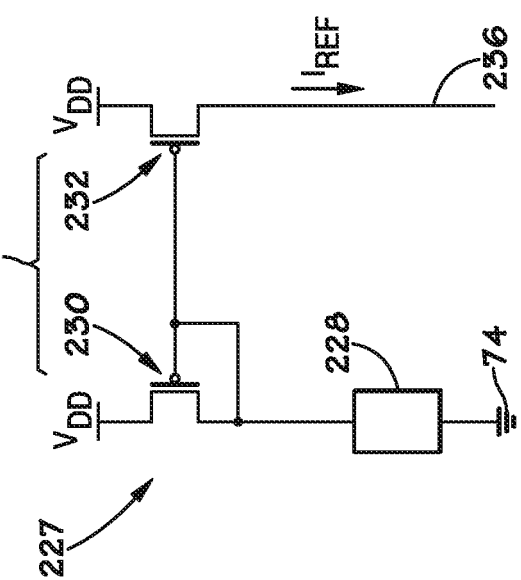

FIG. 28 illustrates an example of a reference current source 227, which may embody the reference current source 104 illustrated in the embodiments of FIGS. 8-10 and 23-24. As described below, the reference current source 227 may cooperate with the switch 100 to converts a digital signal from the analog-to-digital converter 126 to an analog signal. The illustrated reference current source 227 includes a reference device 228 and a current mirror 229 with PMOS transistors 230 and 232. The reference device 228 may include a reference resistor, a reference memory element, or any other device configured to conduct a relatively uniform current. The reference device 228 may be disposed in series between ground 74 and a terminal of the transistor 230. The other terminal of the transistor 230 may be connected to the voltage source $V_{DD}$. The gates of the transistors 230 and 232 may be connected to one another and to a node disposed in series between the transistors 230 and the reference device 228. The terminals of the transistor 232 may be connected to the voltage source $V_{DD}$ and an output signal path 236 through which the reference current $I_{Ref}$ flows.

In operation, the current mirror 229 may copy the current flowing through the reference device 228 to the output signal path 236. The current mirror 229 may do this while keeping the reference current $I_{Ref}$ relatively constant regardless of heavy loads from the bit-line, e.g., immediately after the current switch 100 turns on (FIG. 8). Advantageously, this is believed to improve the accuracy of the delta-sigma modulation circuit 88 (FIG. 8) relative to conventional designs.

Figure 29:
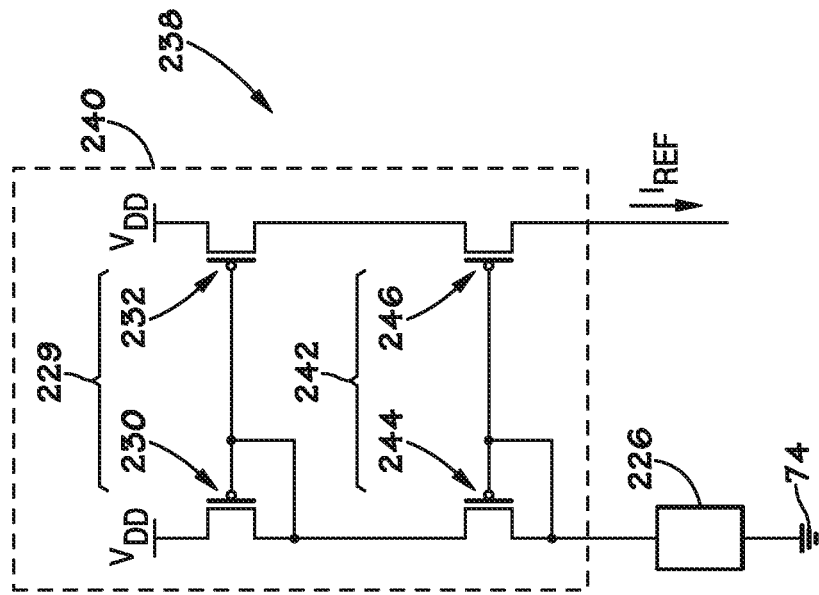
FIGS. 28-31 each illustrate respective examples of a reference current source in accordance with an embodiment of the present invention.

FIG. 29 illustrates another example of a reference current source 238, which may embody the reference current source 104 illustrated in the embodiments of FIGS. 8-10 and 23-24. As described below, the reference current source 238 may cooperate with the switch 100 to converts a digital signal from the analog-to-digital converter 126 to an analog signal. The illustrated reference current source 238 includes the features of the reference current source 224 illustrated in FIG. 27. However, the reference current source 238 may also include additional components to form a cascade current mirror 240. The illustrated cascade current mirror 240 includes the current mirror 228 and a second current mirror 242. The second current mirror 242 may include to PMOS transistors 244 and 246. Advantageously, in systems employing the cascade current mirror 240 the reference current $I_{Ref}$ may track the current through the reference device 226 more accurately than systems employing a single current mirror.

Figure 30:
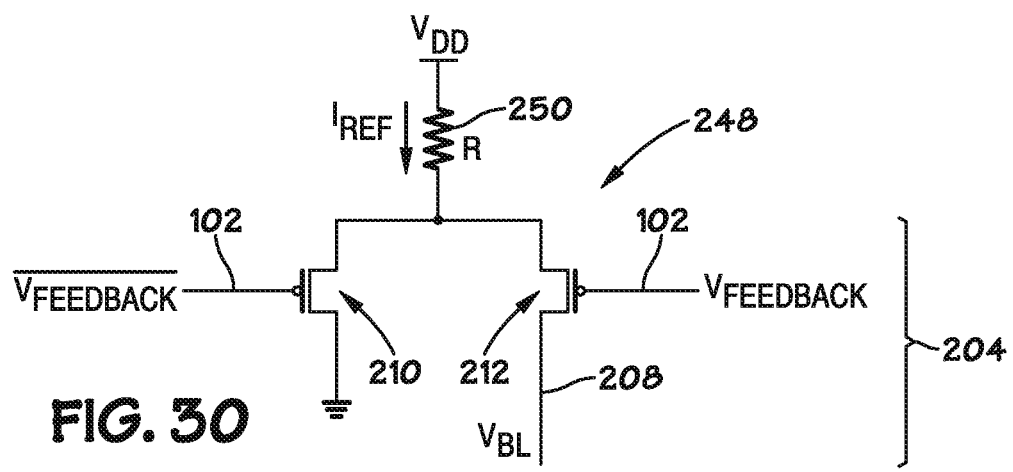

FIG. 30 illustrates another example of a reference current source 248, which may embody the reference current source 104 illustrated in the embodiments of FIGS. 8-10 and 23-24. As described below, the reference current source 248 may cooperate with the switch 100 to converts a digital signal from the analog-to-digital converter 126 to an analog signal. The illustrated reference current source 248 includes a resistor 250 and the switch 204, which was previously described with reference to FIG. 25. The resistor 250 may be disposed in series between the voltage source $V_{DD}$ and the switch 204.

In operation, the reference current source 248 may output a reference current $I_{Ref}$ that is generally proportional to the voltage between the voltage source $V_{DD}$ and the voltage of the bit-line $V_{BL}$. In certain embodiments, the feedback signal $V_{feedback}$ from the comparator 96 (FIG. 8) keeps the voltage of the bit-line $V_{BL}$ approximately equal to the reference voltage $V_{Ref}$. Although the voltage of the bit-line $V_{BL}$ fluctuates relative to the reference voltage $V_{Ref}$ (as illustrated by 11-13), this fluctuation may be relatively small as a percentage of the reference voltage $V_{Ref}$. As a result, for certain purposes, the voltage of the bit-line $V_{BL}$ may be considered approximately equal to the reference voltage $V_{Ref}$. Consequently, in the present embodiment, the reference current may be described by the following equation (Equation 6), in which R is the resistance of the resistor 250:

$$I_{Ref}=(V_{DD}-V_{Ref})/R$$

Figure 31:
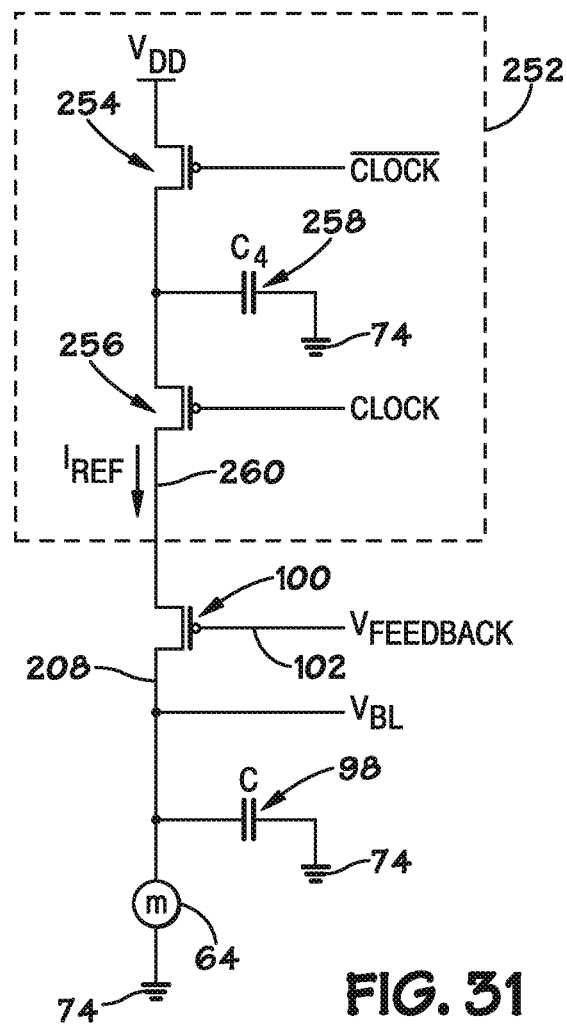

FIG. 31 illustrates another example of a reference current source 252, which may embody the reference current source 104 illustrated in the embodiments of FIGS. 8-10 and 25-26. As described below, the reference current source 252 may cooperate with the switch 100 to converts a digital feedback signal from the analog-to-digital converter 126 to an analog signal. In the present embodiment, the reference current source 252 includes two PMOS transistors 254 and 256 and a capacitor 258. One plate of the illustrated capacitor 258 is connected to a terminal of each of the transistors 254 and 256, and the other plate of the capacitor 258 is connected to ground 74. The other terminal of the transistor 254 is connected to voltage source $V_{DD}$, and the other terminal of the transistor 256 is connected to a reference current signal path 260, which carries the reference current $I_{Ref}$. The gates of the transistors 254 and 256 may be connected to complementary clock signals. As a result, in the present embodiment, the transistors 254 and 256 are neither both on at the same time nor both off at the same time.

In operation, the capacitor 258 may output charge at a generally repeatable rate. In the present embodiment, the capacitor 258 is charged by a current from the voltage source $V_{DD}$ when the clock signal is logic high. When the clock signal transitions to logic low, the capacitor 258 discharges through the transistor 256. In this embodiment, assuming that $V_{Ref}$ approximates $V_{BL}$, the operation of the reference current source 252 may be described by the following equation (Equation 7), in which $C_4$ represents the capacitance of the capacitor 258 and $I_{Avg}$ represents the average reference current $I_{Ref}$:

$$I_{Avg}=C_4*(V_{DD}-V_{Ref})$$

Advantageously, the reference current source 252 may deliver a uniform reference current, on average, while consuming relatively little power. As indicated by Equation 7, in certain embodiments, the average reference current $I_{Avg}$ is a function of generally constant parameters, $C_4$, $V_{DD}$, and $V_{Ref}$. As a result, the average reference current $I_{Avg}$ may be generally the same when reading from, and writing to, the memory element 64. In certain embodiments, this increases the likelihood that the value read from the memory element 64 accurately reflects the value written to the memory element 64. Further, because the capacitor 258 conserves charge and generates relatively little heat compared to a resistor, the reference current source 252 may consume less power than other designs.

Figure 32:
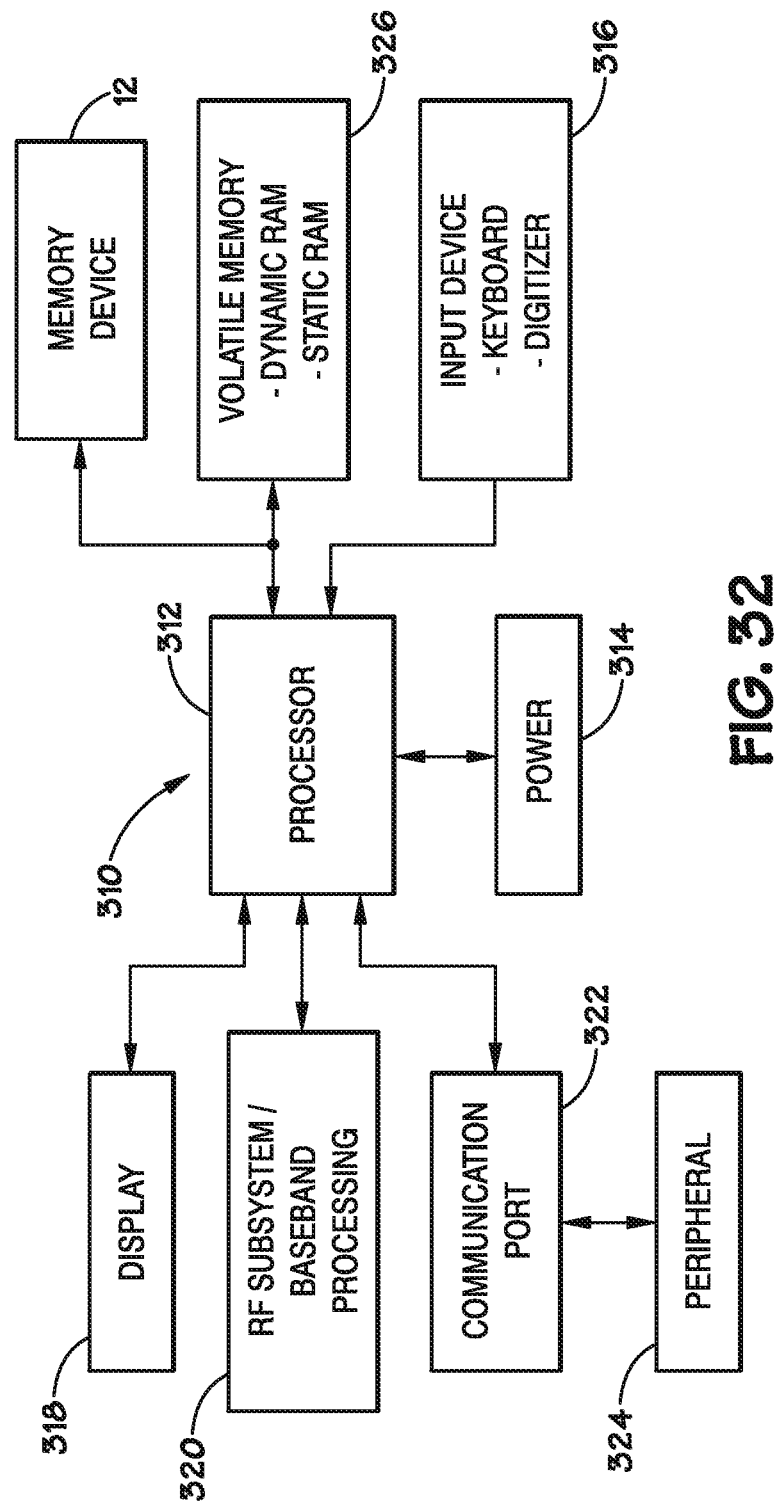
FIG. 32 is an example of a system that includes the memory device of FIG. 2 in accordance with an embodiment of the present invention.

FIG. 32 depicts an exemplary processor-based system 310 that includes the memory device 12. Alternatively or additionally, the system 310 may include the imaging device 13. The system 310 may be any of a variety of types such as a computer, pager, cellular phone, personal organizer, control circuit, etc. In a typical processor-based system, one or more processors 312, such as a microprocessor, control the processing of system functions and requests in the system 310. The processor 312 and other subcomponents of the system 310 may include quantizing circuits, such as those discussed above.

The system 310 typically includes a power supply 314. For instance, if the system 310 is a portable system, the power supply 314 may advantageously include a fuel cell, permanent batteries, replaceable batteries, and/or rechargeable batteries. The power supply 314 may also include an AC adapter, so the system 310 may be plugged into a wall outlet, for instance. The power supply 314 may also include a DC adapter such that the system 310 may be plugged into a vehicle cigarette lighter, for instance.

Various other devices may be coupled to the processor 312 depending on the functions that the system 310 performs. For instance, a user interface 316 may be coupled to the processor 312. The user interface 316 may include buttons, switches, a keyboard, a light pen, a mouse, a digitizer and stylus, and/or a voice recognition system, for instance. A display 318 may also be coupled to the processor 312. The display 318 may include an LCD, an SED display, a CRT display, a DLP display, a plasma display, an OLED display, LEDs, and/or an audio display, for example. Furthermore, an RF sub-system/baseband processor 320 may also be coupled to the processor 312. The RF sub-system/baseband processor 320 may include an antenna that is coupled to an RF receiver and to an RF transmitter (not shown). One or more communication ports 322 may also be coupled to the processor 312. The communication port 322 may be adapted to be coupled to one or more peripheral devices 324 such as a modem, a printer, a computer, or to a network, such as a local area network, remote area network, intranet, or the Internet, for instance.

The processor 312 generally controls the system 310 by implementing software programs stored in the memory. The memory is operably coupled to the processor 312 to store and facilitate execution of various programs. For instance, the processor 312 may be coupled to the volatile memory 326 which may include Dynamic Random Access Memory (DRAM) and/or Static Random Access Memory (SRAM). The volatile memory 326 is typically large so that it can store dynamically loaded applications and data. As described further below, the volatile memory 326 may be configured in accordance with embodiments of the present invention.

The processor 312 may also be coupled to the memory device 12. The memory device 12 may include a read-only memory (ROM), such as an EPROM, and/or flash memory to be used in conjunction with the volatile memory 326. The size of the ROM is typically selected to be just large enough to store any necessary operating system, application programs, and fixed data. Additionally, the non-volatile memory 328 may include a high capacity memory such as a tape or disk drive memory.

The memory device 10 and volatile memory 326 may store various types of software, such as an operating system or office productivity suite including a word processing application, a spreadsheet application, an email application, and/or a database application.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method, comprising:
generating a first signal in response to light impinging upon an imaging element;
combining the first signal with an analog feedback signal to produce a delta signal;
integrating the delta signal to produce a sigma signal;
comparing the sigma signal with a reference signal to produce a digital output signal.

2. The method of claim 1, comprising generating a value associated with the first signal based on the digital output.

3. The method of claim 1, comprising converting the digital output signal to an analog output signal.

4. The method of claim 3, comprising updating a value of the analog feedback signal with a value of the analog output signal.

5. The method of claim 1, comprising transmitting the digital output signal to a counter.

6. The method of claim 5, comprising incrementing or decrementing a count at the counter based on the digital output signal received.

7. The method of claim 6, comprising outputting a second signal indicative of the count, wherein the second signal corresponds to a level of intensity of the light impinging upon the imaging element.

8. A device, comprising:
a data location;
a reference current source; and
a quantizing circuit coupled to the data location and the reference current source, wherein the quantizing circuit comprises:
a combination circuit configured to combine a first signal with an analog feedback signal to produce a delta signal;
an integrator coupled to the combination circuit, wherein the integrator is configured to receive and integrate the delta signal to produce a sigma signal;
an analog-to-digital converter coupled to the integrator, wherein the analog-to-digital converter is configured to receive the sigma signal and compare the sigma signal with a reference signal to produce a digital output signal; and
a digital-to-analog convertor coupled to the analog-to-digital converter and the combination circuit, wherein the digital-to-analog converter comprises a switch configured to cooperate with the reference current source to convert the digital output signal into the analog feedback signal.

9. The device of claim 8, wherein the reference current source comprises a reference current device and a current mirror that operate to generate a reference current based upon a current flowing through the reference current device.

10. The device of claim 8, wherein the reference current source comprises a reference current device and a cascade current mirror that operate to generate a reference current based upon a current flowing through the reference current device.

11. The device of claim 8, wherein the reference current source is configured to generate a reference current based in part upon a voltage level of a voltage source and a second voltage level of the reference signal.

12. The device of claim 8, wherein the reference current source comprises a capacitor coupled to a transistor, wherein the capacitor is configured to discharge through the transistor based upon a clock signal received at the transistor to generate a reference current.

13. The device of claim 8, wherein the data location comprises a flash memory, a phase change memory, a magnetoresistive memory, or a photo-diode.

14. The device of claim 8, wherein the quantizing circuit comprises a digital filter coupled to analog-to-digital converter to receive the digital output signal.

15. The device of claim 14, wherein the digital filter is configured to remove high-frequency noise from the digital output signal and at least a second digital output signal received from the analog-to-digital converter.

16. A device, comprising:
a quantizing circuit, comprising:
 a combination circuit configured to combine a first signal with an analog feedback signal to produce a delta signal;
 an integrator coupled to the combination circuit, wherein the integrator is configured to receive and integrate the delta signal to produce a sigma signal;
 an analog-to-digital converter coupled to the integrator, wherein the analog-to-digital converter is configured to receive the sigma signal and compare the sigma signal with a reference signal to produce a digital output signal; and
 a digital-to-analog convertor coupled to the analog-to-digital converter and the combination circuit, wherein the digital-to-analog converter comprises a switch configured to cooperate with a reference current source to convert the digital output signal into the analog feedback signal.

17. The device of claim 16, wherein the switch is configured to cooperate with the reference current source by routing a reference current generated by the reference current source to ground or to a bit line based upon the digital output signal.

18. The device of claim 16, wherein the switch is configured to cooperate with the reference current source by utilizing a capacitor of the switch to transmit a first current to a bit line as the reference current source transmits a reference current to the bit line.

19. The device of claim 16, wherein the switch is configured to cooperate with the reference current source by utilizing a capacitor of the switch to deliver supplemental power to the current source, wherein the supplemental power is generated from a reference current of the current source.

20. The device of claim 16, wherein the quantizing circuit comprises a digital filter coupled to analog-to-digital converter to receive the digital output signal, wherein the digital filter is configured to output a value that is representative of at least an average value of the digital output signal and at least a second digital output signal received from the analog-to-digital converter.

* * * * *